United States Patent
Oike

(10) Patent No.: US 8,848,076 B2
(45) Date of Patent: Sep. 30, 2014

(54) SOLID-STATE IMAGE CAPTURING APPARATUS, DRIVING METHOD THEREOF AND ELECTRONIC APPARATUS

(75) Inventor: Yusuke Oike, Kanagawa (JP)

(73) Assignee: Sony Corporation, Tokyo (JP)

( * ) Notice: Subject to any disclaimer, the term of this patent is extended or adjusted under 35 U.S.C. 154(b) by 23 days.

(21) Appl. No.: 13/609,482

(22) Filed: Sep. 11, 2012

(65) Prior Publication Data

US 2013/0002917 A1   Jan. 3, 2013

Related U.S. Application Data

(63) Continuation of application No. 12/690,557, filed on Jan. 20, 2010, now Pat. No. 8,330,841.

(30) Foreign Application Priority Data

Jan. 28, 2009   (JP) .................................. 2009-016266

(51) Int. Cl.
| | |
|---|---|
| H04N 3/14 | (2006.01) |
| H04N 5/335 | (2011.01) |
| H04N 5/374 | (2011.01) |
| H01L 27/146 | (2006.01) |
| H04N 5/3745 | (2011.01) |

(52) U.S. Cl.
CPC ........ *H04N 5/3741* (2013.01); *H01L 27/14609* (2013.01); *H04N 5/3745* (2013.01)
USPC ............ 348/294; 348/298; 348/302; 348/312

(58) Field of Classification Search
USPC .................. 348/294, 298, 302, 308, 312; 250/208.1; 257/290–292
See application file for complete search history.

(56) References Cited

U.S. PATENT DOCUMENTS

| | | | |
|---|---|---|---|
| 4,531,156 A  * | 7/1985 | Nishizawa et al. ........... | 348/307 |
| 6,466,266 B1 | 10/2002 | Guidash et al. | |
| 2003/0146389 A1 | 8/2003 | Busse et al. | |
| 2004/0130757 A1 | 7/2004 | Mabuchi | |
| 2005/0040393 A1 | 2/2005 | Hong | |
| 2005/0088553 A1* | 4/2005 | Kuwazawa ................... | 348/294 |
| 2008/0237446 A1 | 10/2008 | Oshikubo et al. | |

(Continued)

FOREIGN PATENT DOCUMENTS

| | | |
|---|---|---|
| JP | 55-027694 | 2/1980 |
| JP | 57-181155 | 11/1982 |

(Continued)

OTHER PUBLICATIONS

Japanese Office Action in related Japanese counterpart JP application No. 2009-016266 dated Jun. 11, 2013.

(Continued)

*Primary Examiner* — Yogesh Aggarwal
(74) *Attorney, Agent, or Firm* — Dentons US LLP

(57) ABSTRACT

A solid-state image capturing apparatus including: a pixel array unit including two-dimensionally arranged pixels each including a photoelectric conversion unit, a transfer transistor that transfers charges accumulated in the photoelectric conversion unit, and a charge discharging transistor that selectively discharges the charges accumulated in the photoelectric conversion unit; and a driving unit that performs driving for reading signals from each pixel of the pixel array unit, and drives the charge discharging transistor by using a signal for the driving.

13 Claims, 16 Drawing Sheets

(56) References Cited

U.S. PATENT DOCUMENTS

2009/0086049 A1* 4/2009 Fujita et al. ............... 348/222.1
2009/0141155 A1   6/2009 Ellis-Monaghan et al.
2011/0254987 A1* 10/2011 Massetti .................... 348/308

FOREIGN PATENT DOCUMENTS

| JP | 61-272965   | 12/1986 |
| JP | 64-073869   | 3/1989  |
| JP | 2001-177765 | 6/2001  |
| JP | 2004-140149 | 5/2004  |
| JP | 2006-311515 | 11/2006 |
| JP | 2007-157912 | 6/2007  |

OTHER PUBLICATIONS

European Supplemental Search Report for related EP Application No. EP 10000190 dated Dec. 13, 2013.
European Communication Article 94(3) for related EP Application No. 10000190.8 dated Dec. 20, 2013.

* cited by examiner

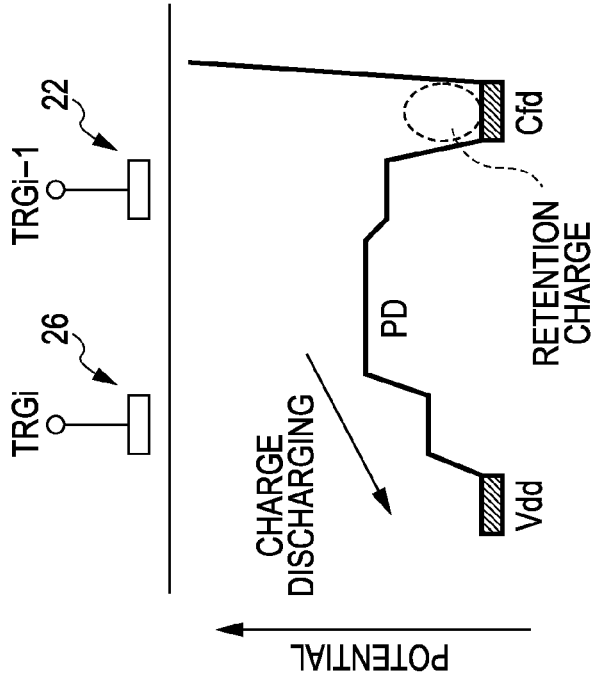
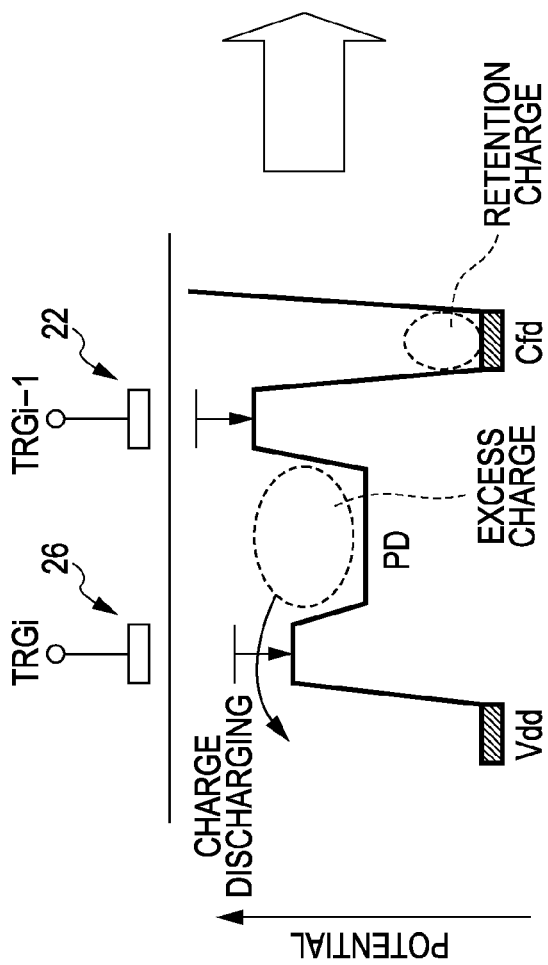
FIG. 16A
FIG. 16B

SOLID-STATE IMAGE CAPTURING APPARATUS, DRIVING METHOD THEREOF AND ELECTRONIC APPARATUS

RELATED APPLICATION DATA

This application is a continuation of U.S. patent application Ser. No. 12/690,557, filed on Jan. 20, 2010, the entirety of which is incorporated herein by reference to the extent permitted by law. The present invention claims priority to and contains subject matter related to Japanese Patent Application No. JP 2009-016266 filed in the Japan Patent Office on Jan. 28, 2009, the entire contents of which being incorporated herein by reference.

BACKGROUND OF THE INVENTION

1. Technical Field

The present invention relates to a solid-state image capturing apparatus, a driving method thereof and an electronic apparatus. In particular, the invention relates to a solid-state image capturing apparatus, such as a CMOS image sensor, having an electronic shutter function, a driving method thereof, and an electronic apparatus having the same.

2. Description of the Related Art

Most CMOS image sensors, which are a kind of a solid-state image capturing apparatus, for example, an X-Y address type solid-state image capturing apparatus, have an electronic shutter function for electronically performing an operation of resetting signal charges accumulated in photoelectric converters (light receiving units) and newly starting accumulation of signal charges. In general, a CMOS image sensor employs a so-called rolling shutter (also referred to as a focal plane shutter) scheme for performing the starting and ending of exposure with respect to each pixel low through sequential scanning.

In the case of employing a rolling shutter scheme for an electronic shutter, since an exposure period is not synchronized with respect to each pixel row, if an object being moved or an object being turned on and off is photographed, an image may be distorted or broken. In this regard, global exposure is realized to perform the starting and ending of exposure at the same timing with respect to all pixels, so that distortion can be prevented when the object being moved or the object being turned on and off is photographed.

Therefore, in order to realize the global exposure by using a CMOS image sensor, a configuration is employed, in which a holding unit (FD or CCD) for holding signal charges is provided separately from a photoelectric conversion unit. Further, the signal charges are transferred from the photoelectric conversion unit to the holding unit with respect to all pixels, so that the exposure end is simultaneously performed with respect to all pixels and synchronization of the exposure period is realized.

However, in a CMOS image sensor employing the configuration in which the holding unit of signal charges is added, during reading of signal charges (photoelectric charges) after exposure, that is, during the period for which signal charges are continuously held in the holding unit, accumulation of electric charges occurs again because the photoelectric conversion unit continues to receive incident light. Thus, when the incident light is strong, the photoelectric conversion unit may be saturated again. Further, if signal charges overflowing from the photoelectric conversion unit leak in the holding unit, an image may be broken.

Therefore, in the related art, separately from a transfer transistor that transfers signal charges in the photoelectric conversion unit to an FD (floating diffusion) section, a charge discharging transistor, which discharges the signal charges in the photoelectric conversion unit to a part different from the FD section, is provided inside the pixel (e.g., refer to Japanese Unexamined Patent Application Publication No. 2004-140149).

SUMMARY OF THE INVENTION

However, if a configuration, in which the charge discharging transistor is newly added to the pixel, is employed, since the number of signal interconnections for driving the charge discharging transistor is increased, layout efficiency is reduced. Further, since the number of interconnections of interconnection layers of an upper layer of the photoelectric conversion unit as the increase in the number of the signal interconnections, if light incident to the photoelectric conversion unit is rejected by upper layer interconnections, the amount of light incident into the photoelectric conversion unit is reduced, so that sensitivity is reduced.

In view of the above issues, it is desirable to provide a solid-state image capturing apparatus, which can prevent layout efficiency and sensitivity from being reduced even in the case of employing a pixel structure having a charge discharging transistor, a driving method thereof, and an electronic apparatus having the same.

According to an embodiment of the invention, there is provided a solid-state image capturing apparatus including a pixel array unit including two-dimensionally arranged pixels each including a photoelectric conversion unit, and a charge discharging transistor that selectively discharges charges accumulated in the photoelectric conversion unit, wherein the charge discharging transistor is driven using a signal for performing driving for reading signals from each pixel of the pixel array unit.

In the solid-state image capturing apparatus having the above configuration, the fact that the charge discharging transistor is driven using the driving signal when performing the driving for reading the signals from each pixel means that the driving signal for the signal reading is commonly used as a driving signal of the charge discharging transistor. Thus, even if a signal line for transmitting the driving signal of the charge discharging transistor is not provided, the charge discharging transistor can be driven using a signal line for transmitting the driving signal for the signal reading. That is, in the case of employing a pixel structure including the charge discharging transistor that selectively discharges the charges accumulated in the photoelectric conversion unit, even if a signal line dedicated for driving the charge discharging transistor is not added, the charge discharging transistor can be driven.

According to the invention, in the pixel structure provided with the charge discharging transistor, the charge discharging transistor can be driven even without adding a dedicated signal line, so that reduction in the layout efficiency or sensitivity accompanied by the addition of the charge discharging transistor is not caused.

BRIEF DESCRIPTION OF THE DRAWINGS

FIGS. 16A and 16B are diagrams illustrating a stats in which charge discharging is completed without addition of excess charges to retention charges held in a capacitance Cfd;

DESCRIPTION OF THE PREFERRED EMBODIMENTS

Hereinafter, preferred embodiments of the invention (hereinafter, referred to as embodiments) will be described in detail with reference to the accompanying drawings. Furthermore, the description will be given in order of the following items.

1. Solid-state image capturing apparatus (example of a CMOS image sensor) to which the invention is applied
  1-1. System configuration
  1-2. Circuit configuration of a unit pixel
2. First embodiment (example in which a selection pulse SEL is commonly used)
3. Second embodiment (first example in which a reset pulse RST is commonly used)
4. Third embodiment (second example in which a reset pulse RST is commonly used)
5. Fourth embodiment (example in which a transmission pulse TRG is commonly used)
6. Fifth embodiment (example in which a transmission pulse TRX is commonly used)
7. Application (example of a holding structure by plural pixels)
8. Modification
9. Electronic apparatus (example of image capturing apparatus)

1. Solid-State Image Capturing Apparatus to which the Invention is Applied

[1-1. System Configuration]

Figure 1:
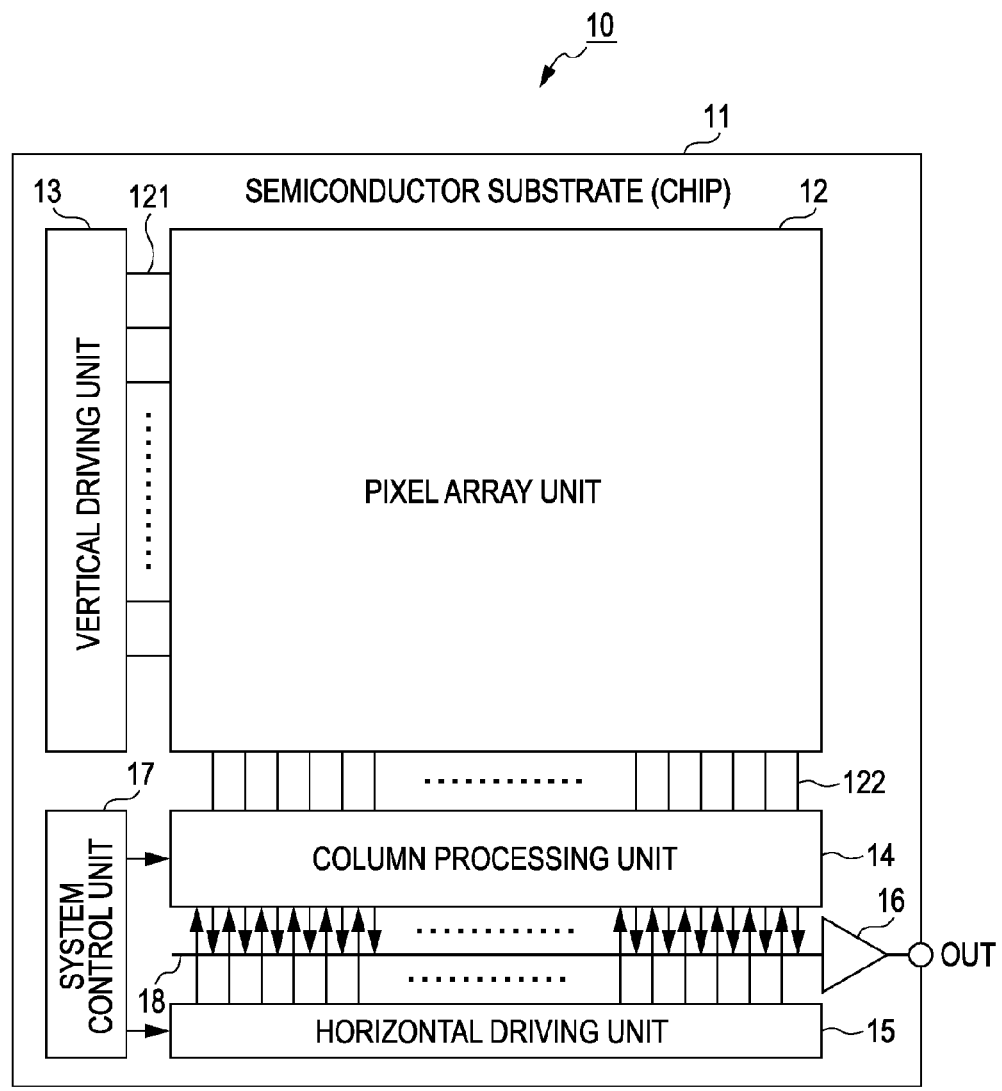
FIG. 1 is a system configuration diagram illustrating an outline of the configuration of a CMOS image sensor to which the invention is applied.

FIG. 1 is a system configuration diagram illustrating an outline of the configuration of a CMOS image sensor which is a kind of a solid-state image capturing apparatus to which the invention is applied, for example, an X-Y address type solid-state image capturing apparatus.

As shown in FIG. 1, the CMOS image sensor 10 according to an application of the invention includes a pixel array unit 12 formed on a semiconductor substrate (chip) 11, and a peripheral circuit portion integrated on the same chip 11 as the pixel array unit 12. As the peripheral circuit, for example, a vertical driving unit 13, a column processing unit 14, a horizontal driving unit 15, an output circuit unit 16 and a system control unit 17 are provided.

In the pixel array unit 12, unit pixels (not shown, which are sometimes written as merely "pixels" in the following description) are two-dimensionally arranged in a matrix, each of which includes a photoelectric conversion unit (photoelectric conversion element) that photoelectrically converts incident visible rays and accumulates signal charges (photoelectric charges) of charge amount corresponding to the light amount thereof. The detailed configuration of the unit pixel will be described later.

Further, in the pixel array unit 12, pixel driving lines 121 are arranged with respect to each row of matrix-type pixel arrangement along the left and right directions (pixel arrangement direction/horizontal direction of pixel rows) of FIG. 1, and vertical signal lines 122 are arranged with respect to each column thereof along the up and down directions (pixel arrangement direction/vertical direction of pixel columns) of FIG. 1. In FIG. 1, each pixel driving line 121 is shown as one line, but the invention is not limited thereto. One end of each pixel driving line 121 is connected to an output terminal corresponding to each row of the vertical driving unit 13.

The vertical driving unit 13 is configured by a row scanning circuit including a shift register and an address decoder, and denotes a pixel driving unit that drives all pixels of the pixel array unit 12 at the same time in units of row or the like. A detailed configuration of the vertical driving unit 13 is not shown, but, in general, the vertical driving unit 13 includes two scanning systems, that is, a reading scanning system and a sweep scanning system.

The reading scanning system selectively scans unit pixels of the pixel array unit 12 sequentially for reading signals from the unit pixels. The sweep scanning system performs sweep scanning with respect to a read row, which is scanned by the reading scanning system before the reading scanning by the time of shutter speed.

According to the sweeping scanning by the sweep scanning system, unnecessary charges are swept out (reset) from the photoelectric conversion units of the unit pixels of the read row. Then, a so called electronic shutter operation is performed by the sweeping (reset) of the unnecessary charges by the sweep scanning system. Herein, the electronic shutter operation means an operation in which photoelectric charges of the photoelectric conversion elements are swept off and exposure is newly started (accumulation of signal charges is started).

Signals read by the reading operation performed by the reading scanning system correspond to the amount of light incident after the reading operation just before that or the electronic shutter operation. Further, the period from the reading timing by the reading operation just before or the sweeping timing by the electronic shutter operation to the reading timing by the reading operation at this time will be accumulation time (exposure time) of photoelectric charges in the unit pixel.

Signals output from each unit pixel of the pixel row having been selectively scanned by the vertical driving unit 13 are supplied to the column processing unit 14 through the respective vertical signal lines 122. The column processing unit 14 performs a predetermined signal processing with respect to signals output from each unit pixel of a selected row through the vertical signal lines 122 by each pixel column of the pixel array unit 12, and temporarily holds pixel signals after the signal processing.

In detail, the column processing unit 14 receives signals of each unit pixel and, for example, performs the signal processing, such as noise elimination by CDS (Correlated Double Sampling), signal amplification or AD (Analog-Digital), with respect to the signals. Fixed pattern noise (e.g., reset noise or variation of a threshold value of an amplifying transistor), which is peculiar to pixels, is eliminated by the noise elimination process. The signal processing exemplified here is just examples, and is not limited thereto.

The horizontal driving unit 15 is configured by a column scanning circuit including a shift register and an address decoder, and sequentially selects unit circuits corresponding to pixel columns in the column processing unit 14. According to the selective scanning by the horizontal driving unit 15, pixel signals processed in the column processing unit 14 by each unit circuit are sequentially output to a horizontal bus 18 and transmitted to the output circuit unit 16 through the horizontal bus 18.

The output circuit unit 16 processes and outputs the signals transmitted through the horizontal bus 18. As the processing in the output circuit unit 16, in addition to a case in which only a buffering processing is performed, various digital signal processing such as adjustment of a black level before the buffering or correction of variation by each column may be cited.

The system control unit 17 receives a clock supplied from the outside of the chip 11, data indicating an operation mode or the like, and outputs data such as internal information of the CMOS image sensor 10. Further, the system control unit 17 includes a timing generator that generates various timing signals, and controls the driving of the peripheral circuit portion such as the vertical driving unit 13, the column processing unit 14 and the horizontal driving unit 15 based on the timing signals generated by the timing generator.

[1-2. Circuit Configuration of the Unit Pixel]

Next, a detailed example of the circuit configuration of the unit pixel 20 will be described. Herein, two circuit configurations of a case of a pixel structure, which has no memory unit that holds charges inside the pixel, and a case of a pixel structure, which has the memory unit, will be described as an example. Hereinafter, a circuit example of the pixel structure, which has no memory unit, will be referred to as a circuit example 1 and a circuit example of the pixel structure, which has the memory unit, will be referred to as a circuit example 2.

(Example of the Pixel Structure which has No Memory Unit Inside the Pixel)

Figure 2:
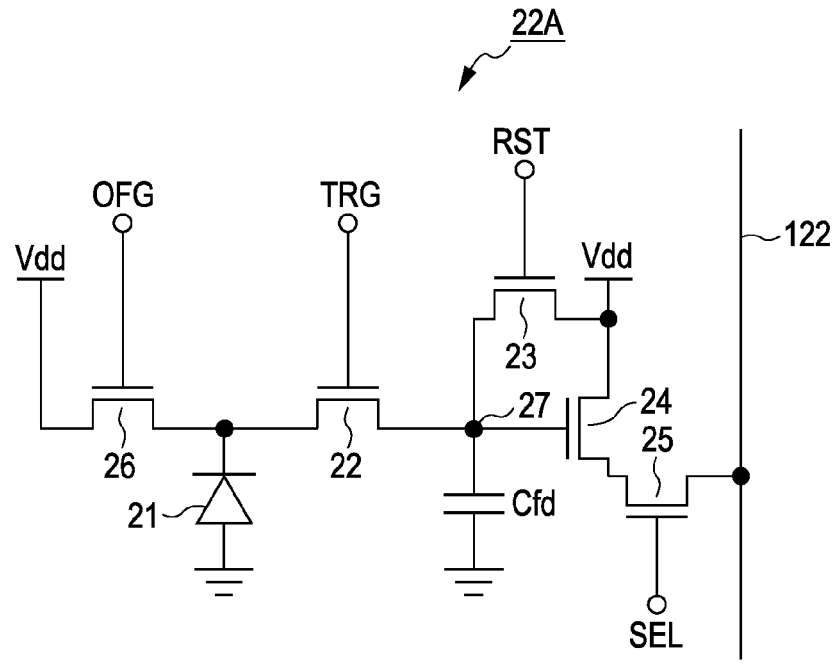
FIG. 2 is a circuit diagram illustrating the circuit configuration of a circuit example 1 of a pixel structure which has no memory unit inside the pixel.

FIG. 2 is a circuit diagram illustrating the circuit configuration of the circuit example 1 of the pixel structure which has no memory unit inside the pixel. The unit pixel 20A according to the circuit example 1, for example, includes a transfer transistor 22, a reset transistor 23, an amplifying transistor 24, a select transistor 25 and a charge discharging transistor 26, in addition to a photodiode 21 which is a photoelectric conversion unit.

The photodiode 21 has an anode electrode connected to a negative power source (e.g., ground), photoelectrically converts received visible rays into photoelectric charges (herein, photoelectrons), whose amount is proportional to the light amount thereof, and accumulates the photoelectric charges. The photodiode 21 has a cathode electrode electrically connected to a gate electrode of the amplifying transistor 24 via the transfer transistor 22.

Hereinafter, a node 27 electrically connected to the gate electrode of the amplifying transistor 24 will be referred to as an FD (Floating Diffusion/Floating Diffusion Region) section. That is, the FD section 27 is a node including an interconnection through which a diffusion layer corresponding to a drain region of the transfer transistor 22 is connected to the gate electrode of the amplifying transistor 24, and includes a floating capacitance Cfd.

The transfer transistor 22 is connected between the cathode electrode of the photodiode 21 and the FD section 27. The transfer transistor 22 is turned on when a transmission pulse TRG is supplied to a gate electrode thereof, so that photoelectric charges accumulated in the photodiode 21 are transferred to the FD section 27.

The reset transistor 23 includes the FD section 27 serving as a first main electrode and a second main electrode connected to a power line of a supply voltage Vdd. In the example, the first main electrode is a source electrode and the second main electrode is a drain electrode. The reset transistor 23 is turned on when a reset pulse RST is supplied to a gate electrode thereof, so that holding charges of the floating capacitance Cfd are discarded to the supply voltage Vdd and thus the floating capacitance Cfd is reset. The FD section 27, that is, if the floating capacitance Cfd is reset, the unit pixel 20 is reset.

The amplifying transistor 24 has the gate electrode connected to the FD section 27 and a drain electrode connected to the power line of the supply voltage Vdd, and outputs a signal having a level corresponding to the potential of the FD section 27. The select transistor 25, for example, has a drain electrode connected to a source electrode of the amplifying transistor 24, and a source electrode connected to the vertical signal line 122.

The select transistor 25 is turned on when a selection pulse SEL is supplied to a gate electrode thereof, so that the unit pixel 20 enters a selection state and a signal supplied from the amplifying transistor 24 is output to the vertical signal line 122. With regard to the select transistor 25, a circuit configuration connected between the power line of the supply voltage Vdd and the drain electrode of the amplifying transistor 24 may be employed.

The charge discharging transistor 26 is connected between the photodiode 21 and a charge discharging node (e.g., the power line of the supply voltage Vdd). The charge discharging transistor 26 is turned on when a charge discharging pulse OFG is supplied to a gate electrode thereof, so that the photoelectric charges in the photodiode 21 are selectively discarded to the charge discharging node.

The charge discharging transistor 26 is provided in the following purpose. That is, as described above, since the charge discharging transistor 26 is turned on during the period for which the accumulation of photoelectric charges is not performed, it can be prevented that excessive light is incident into the photodiode 21 and saturated with photoelectric charges, and then charges exceeding the saturation charge amount is overflowed to the FD section 27 or the periphery thereof.

In the unit pixel 20A according to the circuit example 1 having the above configuration, after the transfer transistor 22 or the charge discharging transistor 26 is turned on, the charges accumulated in the photodiode 21 are discharged, and then the transfer transistor 22 or the charge discharging transistor 26 is turned on. In this way, the accumulation of photoelectric charges in the photodiode 21 is started.

Upon the exposure end, the transfer transistor 22 is turned on, so that the photoelectric charges accumulated in the photodiode 21 are transferred to the floating capacitance Cfd of the FD section 27. Before the photoelectric charges are transferred, the FD section 27 is reset in advance by turning on the reset transistor 23. Then, the voltage of the FD section 27 directly after the reset is read as a reset level by the amplifying transistor 24, and is output to the vertical signal line 122 through the select transistor 25.

After the reset level is read, the charges are transferred to the FD section 27, the voltage of the FD section 27 at that time is read as a signal level by the amplifying transistor 24, and is output to the vertical signal line 122 through the select transistor 25. The sequence of a signal read by the amplifying transistor 24 is not limited to the sequence of the reset level and the signal level. That is, after the photoelectric charges are transferred to the FD section 27 from the photodiode 21, the signal level may be read. Thereafter, the FD section 27 is reset and the reset level may be read.

In this way, the reset level and the signal level sequentially output from the unit pixel 20A to the vertical signal line 122 is supplied to the column processing unit 14 (see FIG. 1), which will be described later, through the vertical signal line 122. Then, in the column processing unit 14, a CDS processing is performed to obtain the difference between the reset level and the signal level, so that the original signal (correct signal), from which fixed pattern noise peculiar to pixels are eliminated, is obtained.

In the unit pixel 20A according to the circuit example 1, the transmission pulse TRG, the reset pulse RST and the selection pulse SEL serve as driving signals used for performing driving for reading signals from the unit pixel 20A.

(Example of the Pixel Structure which has the Memory Unit Inside the Pixel)

Figure 3:
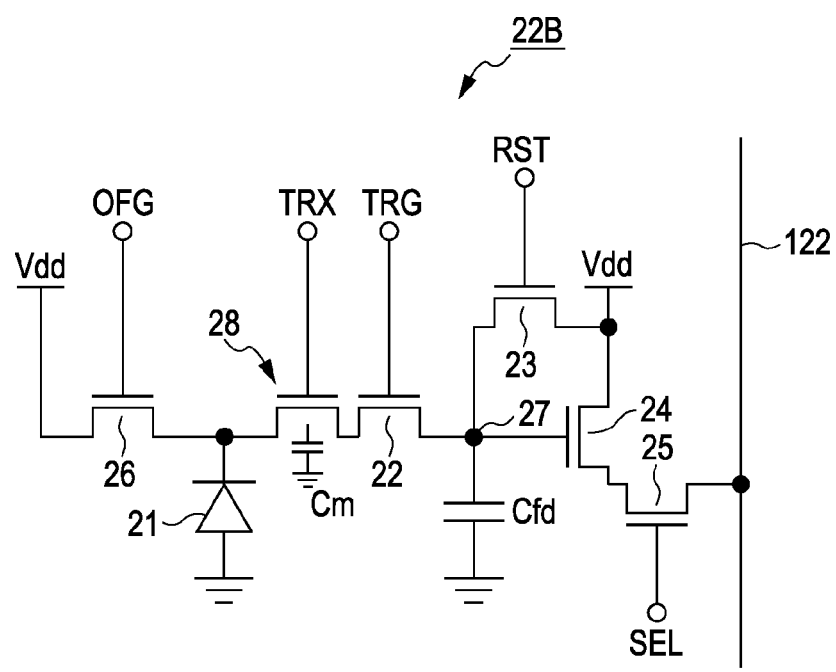
FIG. 3 is a circuit diagram illustrating the circuit configuration of a circuit example 2 of a pixel structure which has a memory unit inside the pixel.

FIG. 3 is a circuit diagram illustrating the circuit configuration of the circuit example 2 of the pixel structure which has the memory unit inside the pixel. In FIG. 3, the same reference numerals are used to designate the same elements as those shown in FIG. 2.

The unit pixel 20B according to the circuit example 2 includes a memory unit 28 in addition to the photodiode 21, the transfer transistor 22, the reset transistor 23, the amplifying transistor 24, the select transistor 25 and the charge discharging transistor 26. The memory unit 28 is provided between the photodiode 21 and the transfer transistor 22.

Since the connection relationships and functions of the photodiode 21, the transfer transistor 22, the reset transistor 23, the amplifying transistor 24, the select transistor 25 and the charge discharging transistor 26 are basically identical to those of the elements according to the unit pixel 20A according to the circuit example 1, detailed description thereof will be omitted in order to avoid the redundancy. The memory unit 28 includes a capacitance Cm for holding photoelectric charges, and has a transfer function of transferring photoelectric charges from the photodiode 21 to the capacitance Cm in response to a transmission pulse TRX.

As the pixel structure having the memory unit 28, for example, an embedded channel structure, which is similar to that of a CCD (Charge Coupled Device), can be employed. However, the invention is not limited to the embedded channel structure, and well known structures (e.g., refer to Japanese Unexamined Patent Application Publication No. 2006-311515 or Japanese Unexamined Patent Application Publication No. 2007-503722) may be employed in addition to the embedded channel structure.

The original purpose of providing the memory unit 28 inside the pixel lies in realizing a noise reduction processing including kTC noise in the reset operation of pixels (e.g., refer to Japanese Unexamined Patent Application Publication No. 2006-311515 or Japanese Unexamined Patent Application Publication No. 2007-503722). Further, if the pixel structure, in which the memory unit 28 capable of holding charges inside the pixel is provided in addition to the FD section 27, is employed, it is possible to obtain the effect of preventing overflowing of photoelectric charges upon the saturation.

In the unit pixel 20B according to the circuit example 2, the transmission pulse TRG, the reset pulse RST, the selection pulse SEL and the transmission pulse TRX serve as driving signals used for performing driving for reading signals from the unit pixel 20B.

As described above, in the CMOS image sensor 10, when employing the pixel structure in which the charge discharging transistor 26 is provided in the unit pixel 20 (20A and 20B), the essence of the invention lies in that the layout efficiency or the sensitivity is prevented from being reduced. Hereinafter, detailed embodiments thereof will be described.

2. First Embodiment

[System Configuration]

Figure 4:
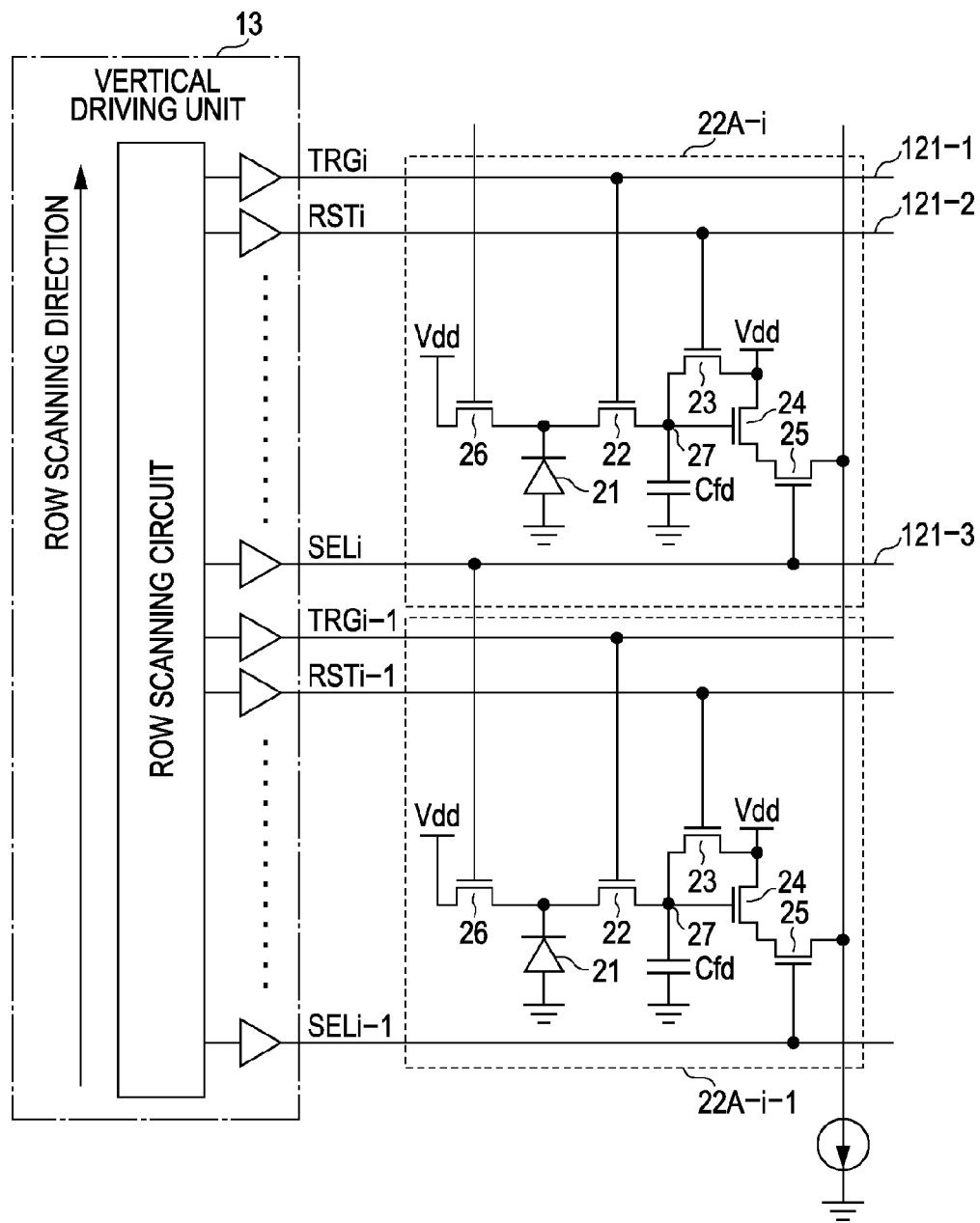
FIG. 4 is a circuit diagram illustrating the configuration of main elements of a CMOS image sensor according to a first embodiment of the invention.

FIG. 4 is a circuit diagram illustrating the configuration of main elements of the CMOS image sensor according to the first embodiment of the invention. Herein, the CMOS image sensor, in which the unit pixel 20A of the circuit example 1 shown in FIG. 2 is two-dimensionally arranged, is described as an example. Further, in order to simplify FIG. 4, two unit pixels 20A-i and 20A-i-1 of a certain pixel column, which are vertically adjacent to each other, are representatively shown.

As shown in FIG. 4, in the unit pixels 20A-i and 20A-i-1, as the pixel driving lines 121, for example, three driving lines such as a transmission line 121-1, a reset line 121-2 and a selection line 121-3 are provided to each pixel row. These driving lines 121-1, 121-2 and 121-3 are respectively connected to output terminals corresponding to the vertical driving unit 13 by each pixel row.

Then, description will be given while focusing on an $i^{th}$ pixel row. The transmission line 121-1 supplies the gate electrode of the transfer transistor 22 with a transmission pulse TRGi of an $i^{th}$ row, which is output from the vertical driving unit 13, in units of pixel row. The reset line 121-2 supplies the gate electrode of the reset transistor 23 with a reset pulse RSTi of the $i^{th}$ row, which is output from the vertical driving unit 13, in units of pixel row.

The selection line 121-3 supplies the gate electrode of the select transistor 25 with a selection pulse SELi of the $i^{th}$ row, which is output from the vertical driving unit 13, in units of pixel row, and supplies the gate electrode of the charge discharging transistor 26 of the previous row (i.e., an $(i-1)^{th}$ row)

with the $i^{th}$ selection pulse SELi in units of pixel row. That is, as the charge discharging pulse OFGi-1 of the charge discharging transistor 26 of the unit pixel 20A-i-1 for which signal reading is previously performed with respect to a row scanning direction, the selection pulse SELi of the select transistor 25 of the unit pixel 20A-i, for which signal reading is performed thereafter, is commonly used.

[Driving Example]

Next, one example of a driving method of the CMOS image sensor according to the first embodiment will be described using the timing chart of FIG. 5.

First, with respect to all pixel rows, the transmission pulse TRGi and the reset pulse RSTi are in an active state (high level) at time t11, and charges accumulated in the photodiode 21 are discharged, so that the global exposure is started. With respect to the operation of discharging the accumulated charges, since no problem may occur although the charge discharging transistor 26 is turned on as described above, the selection pulse SEL may be in the active state in the global exposure.

During the period for which the global exposure is performed, photoelectric charges are accumulated in the photodiode 21. Then, the transmission pulse TRGi is in the active state at time t12 at which the global exposure is ended, so that the charges accumulated in the photodiode 21 are transferred to the floating capacitance Cfd of the FD section 27. The above operation is performed during the period for which the global exposure is performed.

Reading of signals from the unit pixel 20A is performed by each pixel row. In detail, in signal reading of the $(i-1)^{th}$ row in which the selection pulse SELi-1 is in the active state at time t13, first, the photoelectric charges held in the floating capacitance Cfd of the FD section 27 are read as a signal level. The period for which the signal level is read will be referred to as D period.

Next, the reset pulse RSTi is in the active state at time t14, so that the floating capacitance Cfd of the FD section 27 is reset. Then, the voltage of the FD section 27 when the floating capacitance Cfd is reset is read as a reset level. The period for which the reset level is read will be referred to as P period.

Consecutively, the reason for entering the reading operation of the $i^{th}$ row will be described. An operation is performed between the reading operation of the $(i-1)^{th}$ row and the reading operation of the $i^{th}$ row to prevent the photoelectric charges from overflowing due to the saturation of the photodiode 21. In detail, in the period between t15 and t16, the selection pulse SELi is in the active state, and the charge discharging transistor 26 is turned on, so that the photoelectric charges of the photodiode 21 are charged to the supply voltage Vdd. Thus, the saturation of the photodiode 21 can be prevented.

As described above, in the CMOS image sensor according to the first embodiment, the charge discharging transistor 26 is driven using the selection pulse SELi when performing the driving for reading the signals from the unit pixel 20A-i. Further, since the selection pulse SELi is used as the charge discharging pulse OFG of the charge discharging transistor 26, even if a signal line dedicated for the charge discharging pulse OFG is not provided, the selection line 121-3 for the selection pulse SEL is used as the dedicated signal line, so that the charge discharging transistor 26 can be driven.

That is, in the CMOS image sensor having the pixel structure with the charge discharging transistor 26, even if the signal line dedicated for driving the charge discharging transistor 26 is not added, the charge discharging transistor 26 can be driven. In this way, the configuration, in which the signal line dedicated for driving the charge discharging transistor 26 is not necessary, is employed, so that the reduction in the layout efficiency or sensitivity accompanied by the addition of the charge discharging transistor 26 is not caused.

Further, according to the embodiment, as the driving signal (i.e., the charge discharging pulse OFG) of the charge discharging transistor 26 of the $(i-1)^{th}$ row, the selection pulse SELi of the select transistor 25 of the $i^{th}$ row for which the signal reading is performed after the $(i-1)^{th}$ row is used. However, the invention is not limited thereto. That is, on the assumption that the exposure period is separated from the reading period by only the global exposure operation, no problem occurs even if the selection pulse SEL of an arbitrary pixel row is used.

Figure 5:
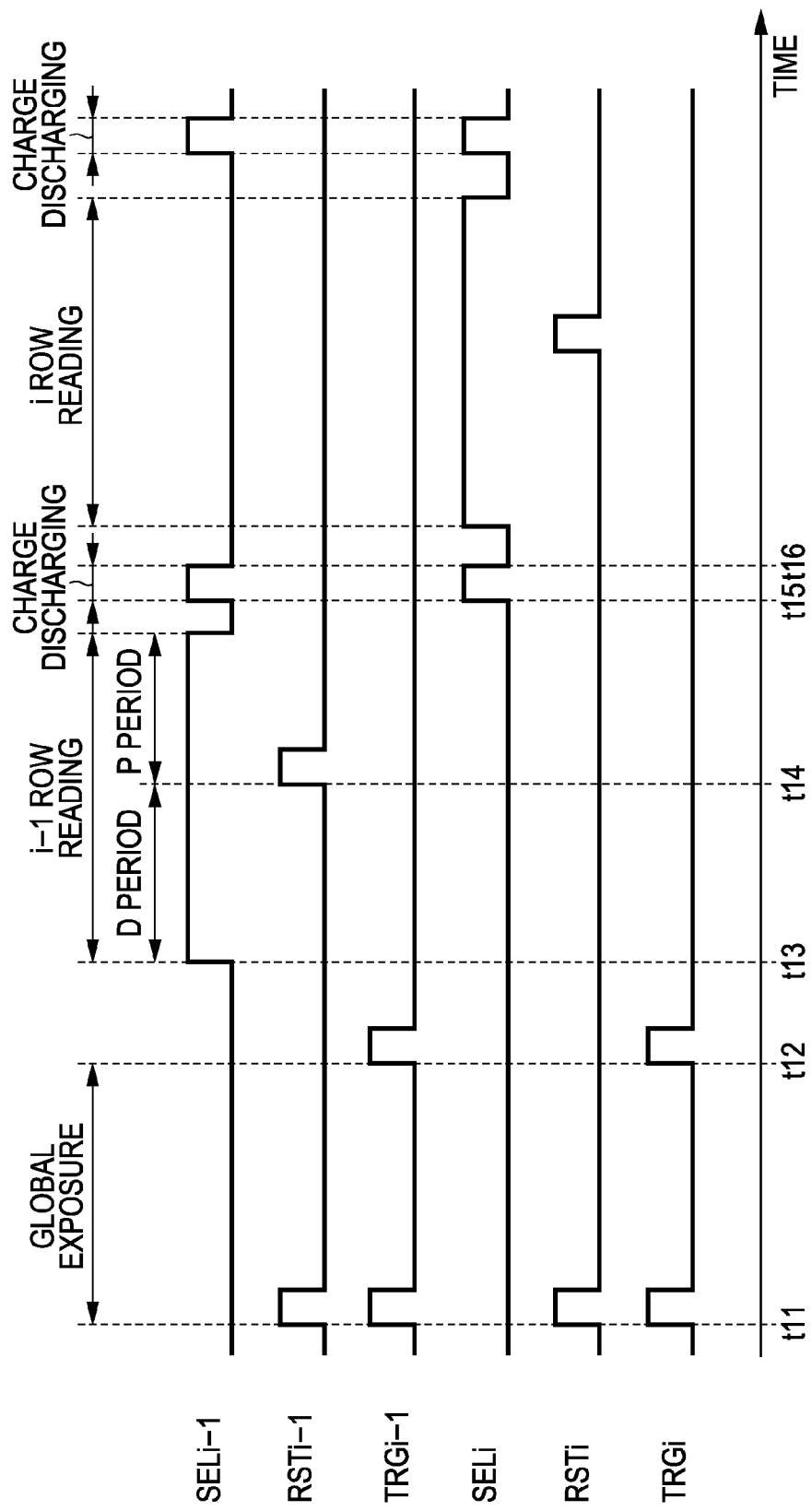
FIG. 5 is a timing chart illustrating one example of a driving method of a CMOS image sensor according to a first embodiment.

In the common use of the selection pulse SEL, as in the case of the driving example of FIG. 5, as the charge discharging pulse OFG of the charge discharging transistor 26 in a pixel previously read with respect to the row scanning direction (reading scanning direction), it is preferred that the selection pulse SEL in a pixel, which is read thereafter, is used. The reason for this is as follows.

As the charge discharging pulse OFG in the pixel previously read with respect to the row scanning direction, it is preferred that the selection pulse SEL of the pixel, which is read thereafter, is used, so that it is possible to deal with the rolling shutter operation which is general driving of the CMOS image sensor. Herein, differently from the global exposure, the rolling shutter operation corresponds to a driving method in which exposure is started after the charges accumulated in the photodiode 21 are sequentially discharged in the row scanning direction, and the end of the exposure and the reading of signals are sequentially performed.

Figure 6:
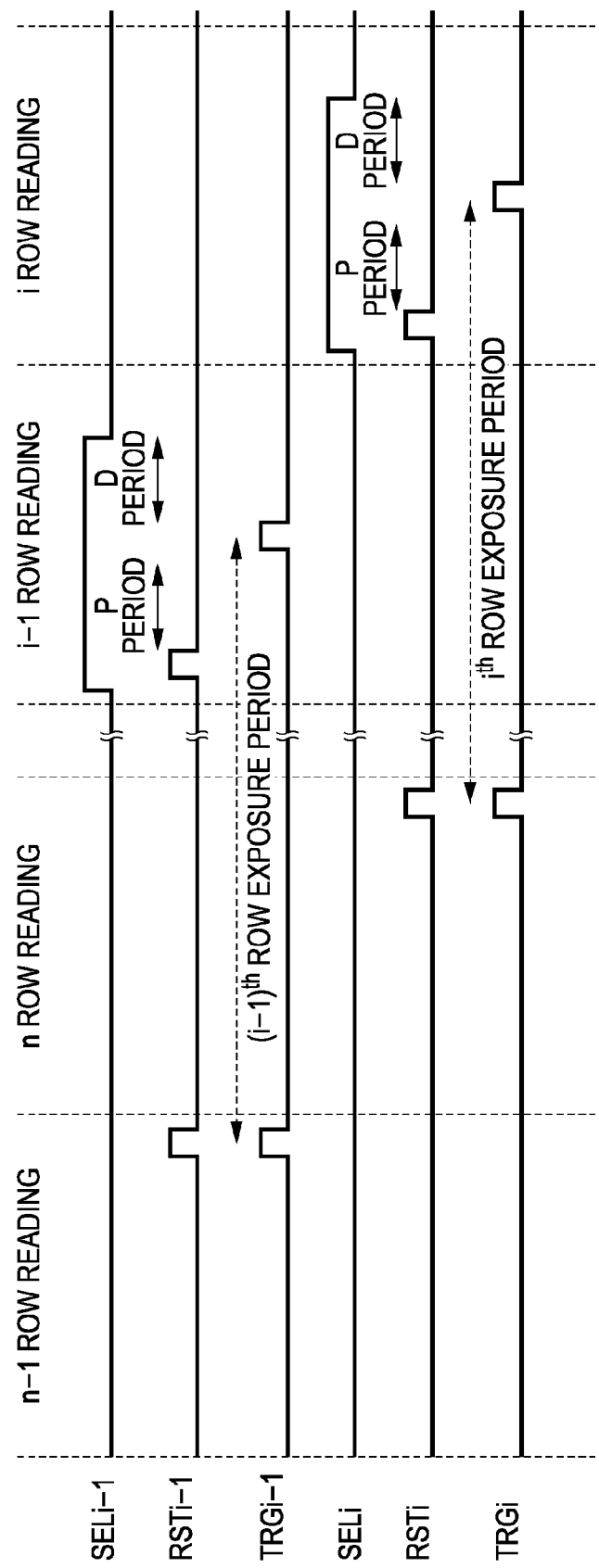
FIG. 6 is a timing chart illustrating a driving example when a rolling shutter operation is performed according to a first embodiment.

FIG. 6 illustrates a driving example in the case of the rolling shutter operation. When focusing on the $(i-1)^{th}$ row, exposure is started after the charges accumulated in the photodiode 21 are discharged during the reading period of a different row (an $(n-1)^{th}$ row), and then the reset level in the P period and the signal in the D period during the reading period of the $(i-1)^{th}$ row are respectively read. Similarly to this, in relation to the next $i^{th}$ row, exposure is started in a different row ($n^{th}$ row).

In such a case, as the charge discharging pulse OFG in the pixel previously read, the selection pulse SEL of the pixel, which is read thereafter, is used, so that it is possible to drive the CMOS image sensor such that the accumulated charges before reading can be prevented from being discarded from the charge discharging transistor 26 by the selection pulse SEL of a different row.

As described above, the charge discharging pulse OFG held in common is satisfied if the charge discharging pulse OFG is advanced with respect to the selection pulse SEL by one row (one pixel). Thus, the number of advanced rows is arbitrary. In addition, when the charge discharging pulse OFG is held in common in a pixel advanced by two rows (two pixels) or more, an efficient reading sequence may be obtained.

For example, a case may occur in which plural types of color filters such as Bayer arrangement are stacked in each pixel, and, in an operation of adding pixels having the same color, the pixels having the same color are continuously read by two rows. That is, an operation sequence, in which an $(i+2)^{th}$ row is read next to an $i^{th}$ row and then an $(i+1)^{th}$ row and an $(i+3)^{th}$ row are read, may be efficient. In such a case, it is preferred that the selection pulse SEL of a pixel advanced by two rows is used as the charge discharging pulse OFG.

Figure 7:
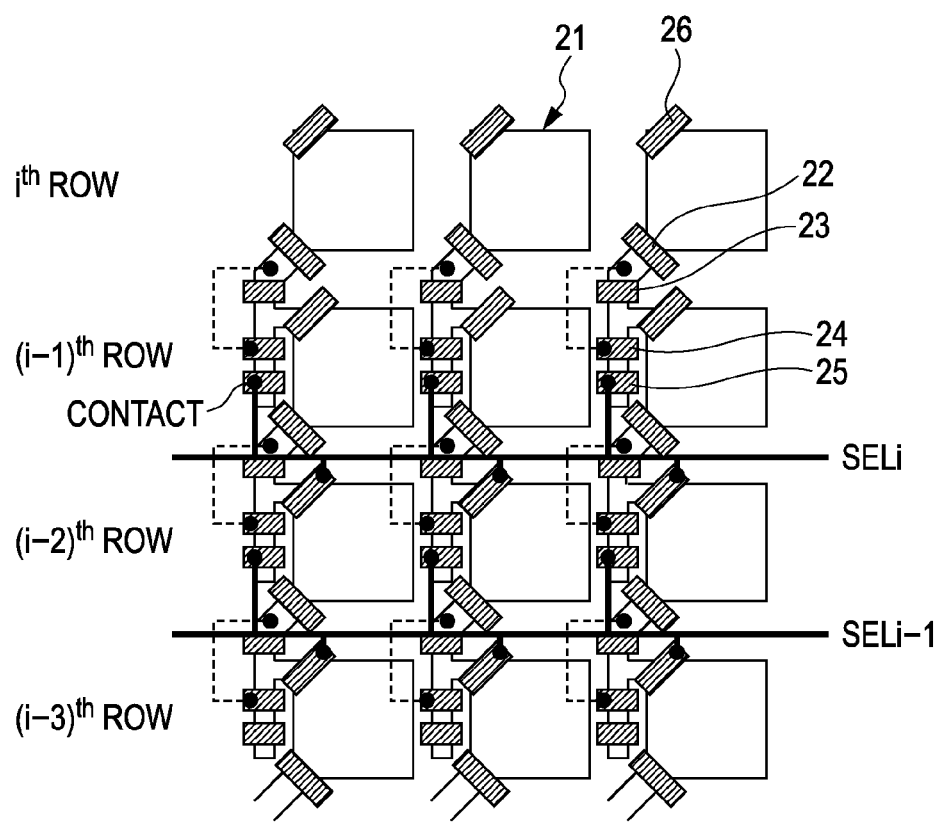
FIG. 7 is a pixel layout diagram illustrating one example of arrangement of transistors and lines.

FIG. 7 is one example of arrangement of transistors and lines. In such an example, by the selection line 121-3 of the selection pulse SEL of an $i^{th}$ row advanced by two rows, the gate electrode of the charge discharging transistor 26 of an $(i-2)^{th}$ row is driven. In FIG. 7, in order to simplify the drawing, the pixel driving line 121 other than the selection line 121-3, that is, the transmission line 121-1 and the reset line 121-2 are not shown.

Further, according to the embodiment, a case in which the unit pixel 20 is the unit pixel 20A of the circuit example 1 as shown in FIG. 2 is described as an example. However, no problem occurs even if the unit pixel 20 is the unit pixel 20B of the circuit example 2 as shown in FIG. 3, that is, the unit pixel 20B having the memory unit 28 separately from the FD section 27.

3. Second Embodiment

Figure 8:
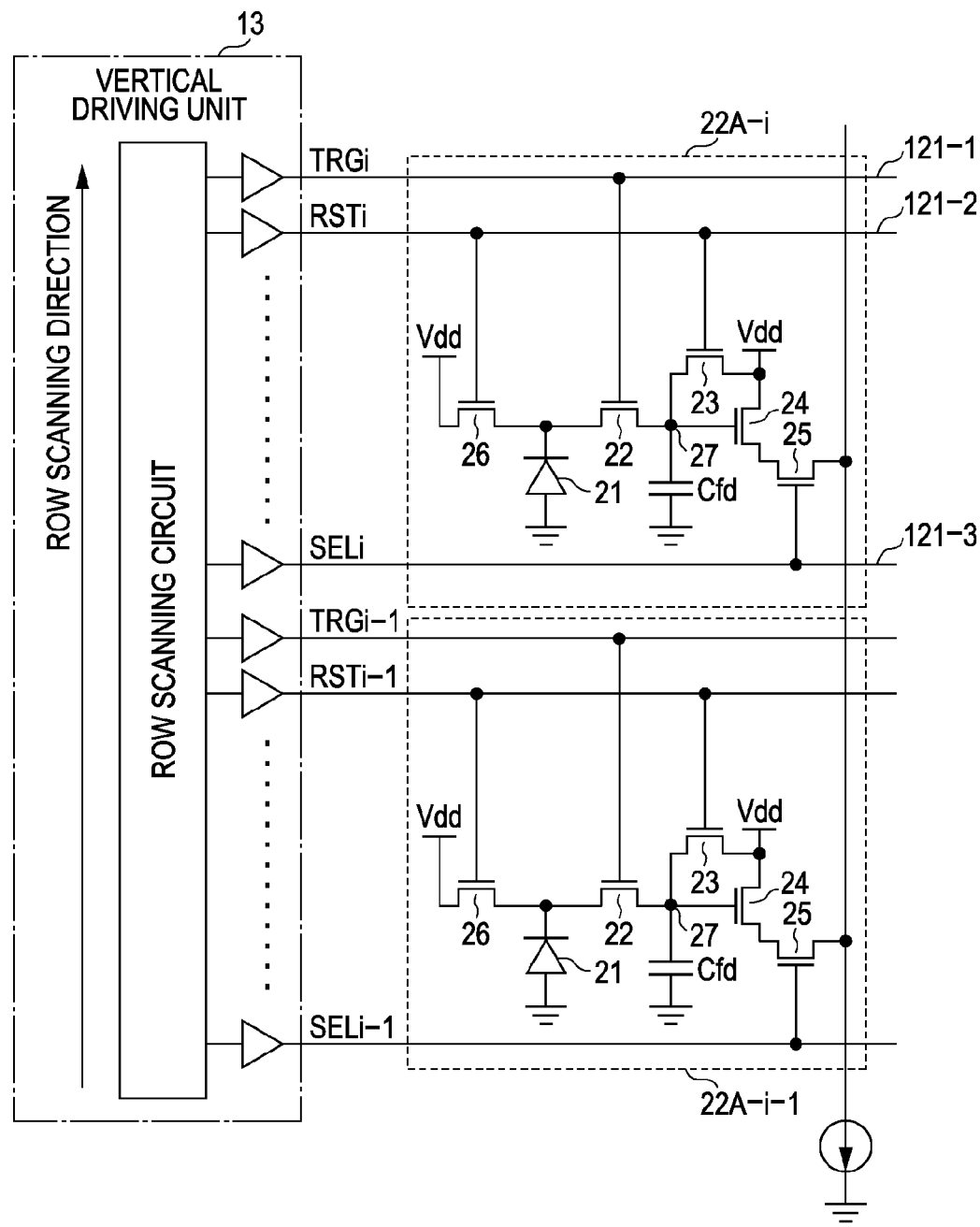
FIG. 8 is a circuit diagram illustrating the configuration of main elements of a CMOS image sensor according to a second embodiment of the invention.

FIG. 8 is a circuit diagram illustrating the configuration of main elements of the CMOS image sensor according to the second embodiment of the invention. In FIG. 8, the same reference numerals are used to designate the same elements as those shown in FIG. 4.

The CMOS image sensor according to the embodiment is based on the CMOS image sensor in which the unit pixel 20A of the circuit example 1 shown in FIG. 2 is two-dimensionally arranged. Further, in order to simplify FIG. 8, two unit pixels 20A-i and 20A-i-1 of a certain pixel column, which are vertically adjacent to each other, are representatively shown.

As shown in FIG. 8, in the unit pixels 20A-i and 20A-i-1, as the pixel driving lines 121, for example, three driving lines such as the transmission line 121-1, the reset line 121-2 and the selection line 121-3 are provided by each pixel row. These driving lines 121-1, 121-2 and 121-3 are respectively connected to output terminals corresponding to the vertical driving unit 13 by each pixel row.

Then, description will be given while focusing on the $i^{th}$ pixel row. The transmission line 121-1 supplies the gate electrode of the transfer transistor 22 with the transmission pulse TRGi of the $i^{th}$ row, which is output from the vertical driving unit 13, in units of pixel row. The selection line 121-3 supplies the gate electrode of the select transistor 25 with the selection pulse SELi of an $i^{th}$ row, which is output from the vertical driving unit 13, in units of pixel row.

Meanwhile, the reset line 121-2 supplies the gate electrode of the reset transistor 23 with the reset pulse RSTi of an $i^{th}$ row, which is output from the vertical driving unit 13, in units of pixel row, and supplies the gate electrode of the charge discharging transistor 26 of the same pixel row with the reset pulse RSTi of an $i^{th}$ row in units of pixel row.

As described above, in the CMOS image sensor according to the second embodiment, the charge discharging transistor 26 is driven using the reset pulse RST when performing the driving for reading the signals from the unit pixel 20A. Further, since the reset pulse RST is used as the charge discharging pulse OFG of the charge discharging transistor 26, even if a signal line dedicated for the charge discharging pulse OFG is not provided, the selection line 121-2 for the reset pulse RST is used as the dedicated signal line, so that the charge discharging transistor 26 can be driven.

That is, similarly to the first embodiment, in the CMOS image sensor having the pixel structure with the charge discharging transistor 26, even if the signal line dedicated for driving the charge discharging transistor 26 is not added, the charge discharging transistor 26 can be driven. In this way, the configuration, in which the signal line dedicated for driving the charge discharging transistor 26 is not necessary, is employed, so that the reduction in the layout efficiency or sensitivity accompanied by the addition of the charge discharging transistor 26 is not caused.

In addition, in the CMOS image sensor including the unit pixel 20A of the circuit example 1 as shown in FIG. 2, when the reset pulse RST and the charge discharging pulse OFG are held in common, the charge discharging transistor 26 operates only for charge discharging when exposure is started. This is because, if the charge discharging transistor 26 is turned on and the reset pulse RST is in an active state during the reading period for which photoelectric charges are held in the floating capacitance Cfd, the reset transistor 23 is also turned on and thus the accumulated charges of the floating capacitance Cfd may be lost.

4. Third Embodiment

[System Configuration]

Figure 9:
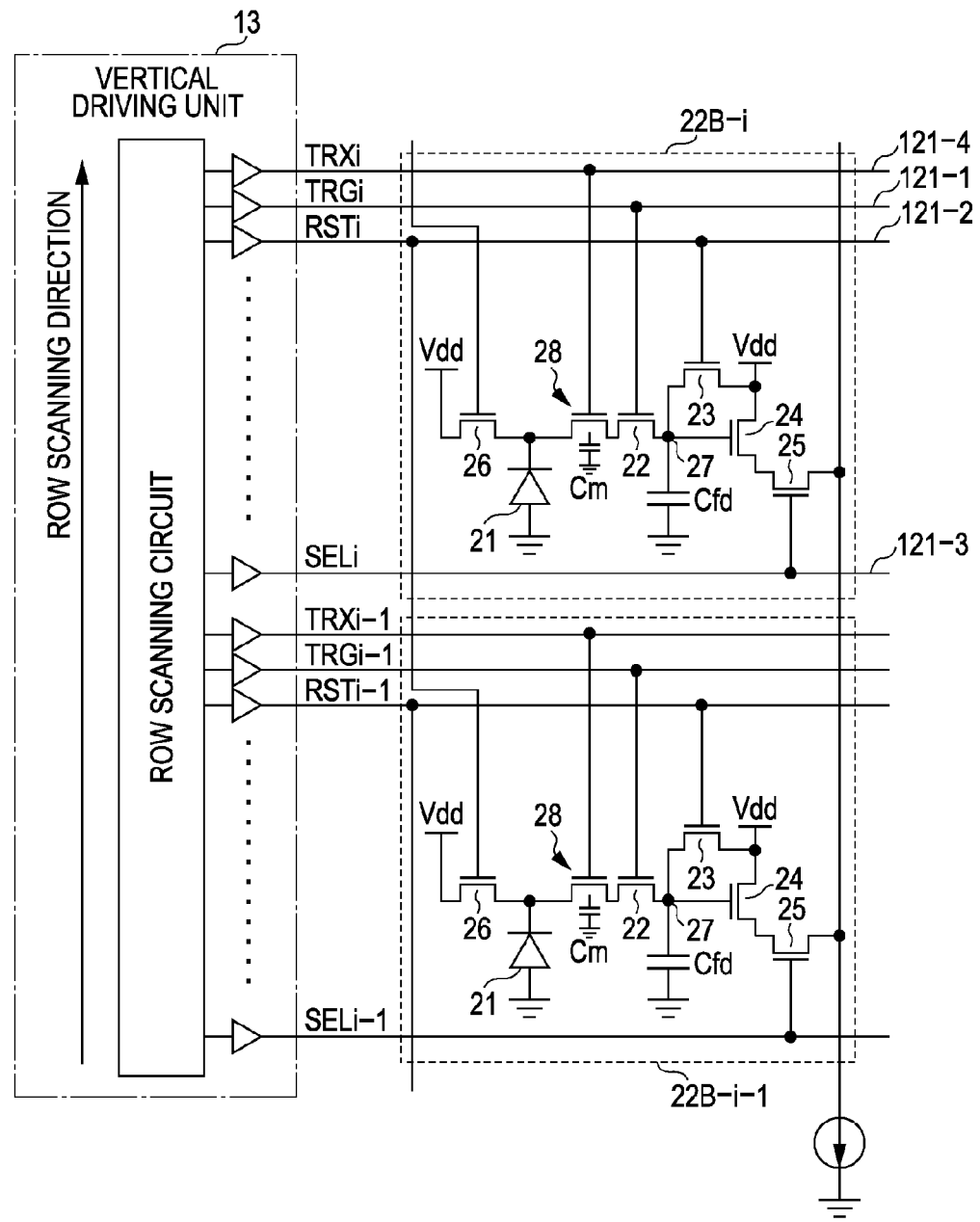
FIG. 9 is a circuit diagram illustrating the configuration of main elements of a CMOS image sensor according to a third embodiment of the invention.

FIG. 9 is a circuit diagram illustrating the configuration of main elements of the CMOS image sensor according to the third embodiment of the invention. In FIG. 9, the same reference numerals are used to designate the same elements as those shown in FIG. 4.

The CMOS image sensor according to the embodiment is based on the CMOS image sensor in which the unit pixel of the circuit example 2 shown in FIG. 3, that is, the unit pixel 20B including the memory unit 28 that holds charges inside the pixel is two-dimensionally arranged. Further, in order to simplify FIG. 9, two unit pixels 20B-i and 20B-i-1 of a certain pixel column, which are vertically adjacent to each other, are representatively shown.

As shown in FIG. 9, in the unit pixels 20B-i and 20B-i-1, as the pixel driving lines 121, for example, four driving lines such as the transmission line 121-1, the reset line 121-2, the selection line 121-3 and the transmission line 121-4 are provided to each pixel row. These driving lines 121-1, 121-2, 121-3 and 121-4 are respectively connected to output terminals corresponding to the vertical driving unit 13 by each pixel row.

Then, description will be given while focusing on the $i^{th}$ pixel row. The transmission line 121-1 supplies the gate electrode of the transfer transistor 22 with the transmission pulse TRGi of the $i^{th}$ row, which is output from the vertical driving unit 13, in units of pixel row. The selection line 121-3 supplies the gate electrode of the select transistor 25 with the selection pulse SELi of the $i^{th}$ row, which is output from the vertical driving unit 13, in units of pixel row. The transmission line 121-4 supplies the gate electrode of the memory unit 28 with the transmission pulse TRXi of the $i^{th}$ row, which is output from the vertical driving unit 13, in units of pixel row.

Meanwhile, the reset line 121-2 supplies the gate electrode of the reset transistor 23 with the reset pulse RSTi of the $i^{th}$ row, which is output from the vertical driving unit 13, in units of pixel row, and supplies the gate electrode of the charge discharging transistor 26 of the previous row (i.e., the $(i-1)^{th}$ row) with the reset pulse RSTi of the $i^{th}$ row in units of pixel row. That is, as the charge discharging pulse OFGi-1 of the pixel 20B-i-1 for which signal reading is previously performed with respect to the row scanning direction, the reset pulse RSTi of the pixel 20B-i, for which signal reading is performed thereafter, is commonly used.

If the pixel structure including the memory unit 28 according to the circuit example 2 is employed, it is possible to obtain the effect of preventing overflowing of charges upon the saturation. In the CMOS image sensor including the unit pixel 20B according to the circuit example 2, as well known in the related art, photoelectric charges accumulated in the photodiode 21 through the global exposure are simultaneously transferred to the memory unit 28 with respect to all pixels, and held in the capacitance Cm. Then, the photoelectric charges are transferred from the FD section 27 to the memory unit 28 upon the reading.

[Driving Example]

Figure 10:
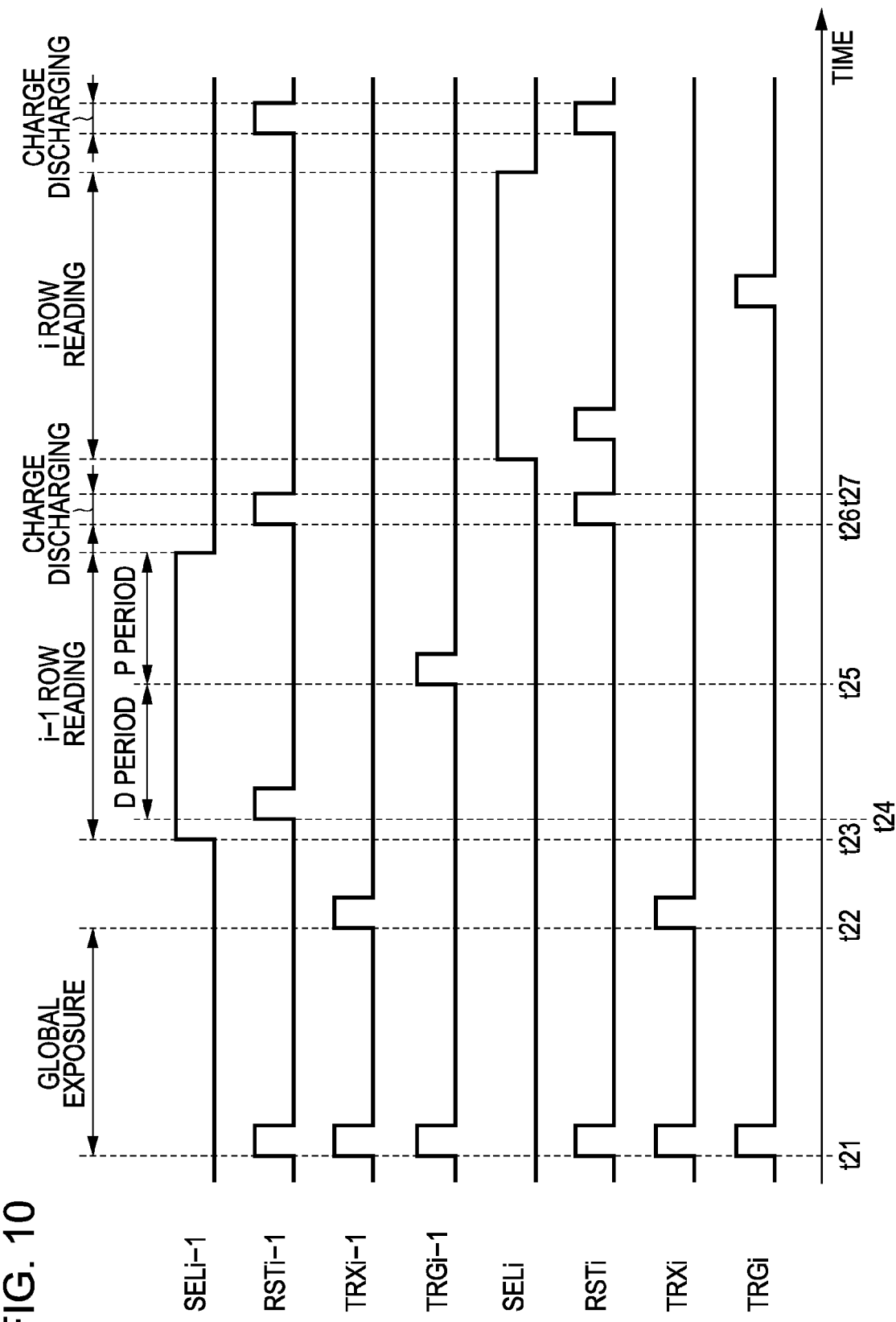
FIG. 10 is a timing chart illustrating one example of a driving method of a CMOS image sensor according to a third embodiment.

Next, one example of a driving method of the CMOS image sensor according to the third embodiment will be described using the timing chart of FIG. 10.

First, with respect to all pixel rows, the reset pulse RSTi, the transmission pulse TRXi and the transmission pulse TRXi are in an active state at time t21, and charges accumulated in the photodiode 21 are discharged, so that the global exposure is started. At this time, when the charges accumulated in the photodiode 21 are completely discharged via the charge discharging transistor 26, transfer driving to the memory unit 28 by the transmission pulse TRXi may be omitted.

During the period for which the global exposure is performed, photoelectric charges are accumulated in the photodiode 21. Then, the transmission pulse TRXi is in the active state at time t22 at which the global exposure is ended, so that the charges accumulated in the photodiode 21 are transferred to the memory unit 28 and held in the capacitance Cm. The above operation is performed during the period for which the global exposure is performed.

Reading of signals from the unit pixel 20B is performed by each pixel row. In detail, if the selection pulse SELi-1 is in the active state at time t23, the signal reading period of the $(i-1)^{th}$ row is reached. In the signal reading period of the $(i-1)^{th}$ row, first, the reset pulse RSTi-1 is in the active state at time t24, so that the floating capacitance Cfd of the FD section 27 is reset. Then, the voltage of the FD section 27 at that time is read as the reset level (P period).

Thereafter, the transmission pulse TRGi-1 is in the active state at time t25, so that the photoelectric charges are transferred to the capacitance Cm of the memory unit 28 to the floating capacitance Cfd of the FD section 27. Then, the photoelectric charges held in the floating capacitance Cfd is read as the signal level (D period).

Consecutively, the reason for entering the reading operation of the $i^{th}$ row will be described. An operation is performed between the reading operation of the $(i-1)^{th}$ row and the reading operation of the $i^{th}$ row to prevent the photoelectric charges from overflowing due to the saturation of the photodiode 21. In detail, in the period between t26 and t27, the reset pulse RSTi is in the active state and the charge discharging transistor 26 is turned on with a desired frequency, so that the photoelectric charges of the photodiode 21 are charged to the level of the supply voltage Vdd. Thus, the saturation of the photodiode 21 can be prevented.

As described above, similarly to the second embodiment, the CMOS image sensor according to the third embodiment employs a configuration in which the signal line dedicated for driving the charge discharging transistor 26 is not necessary. Consequently, similarly to the first and second embodiments, the reduction in the layout efficiency or sensitivity accompanied by the addition of the charge discharging transistor 26 is not caused.

Figure 11:
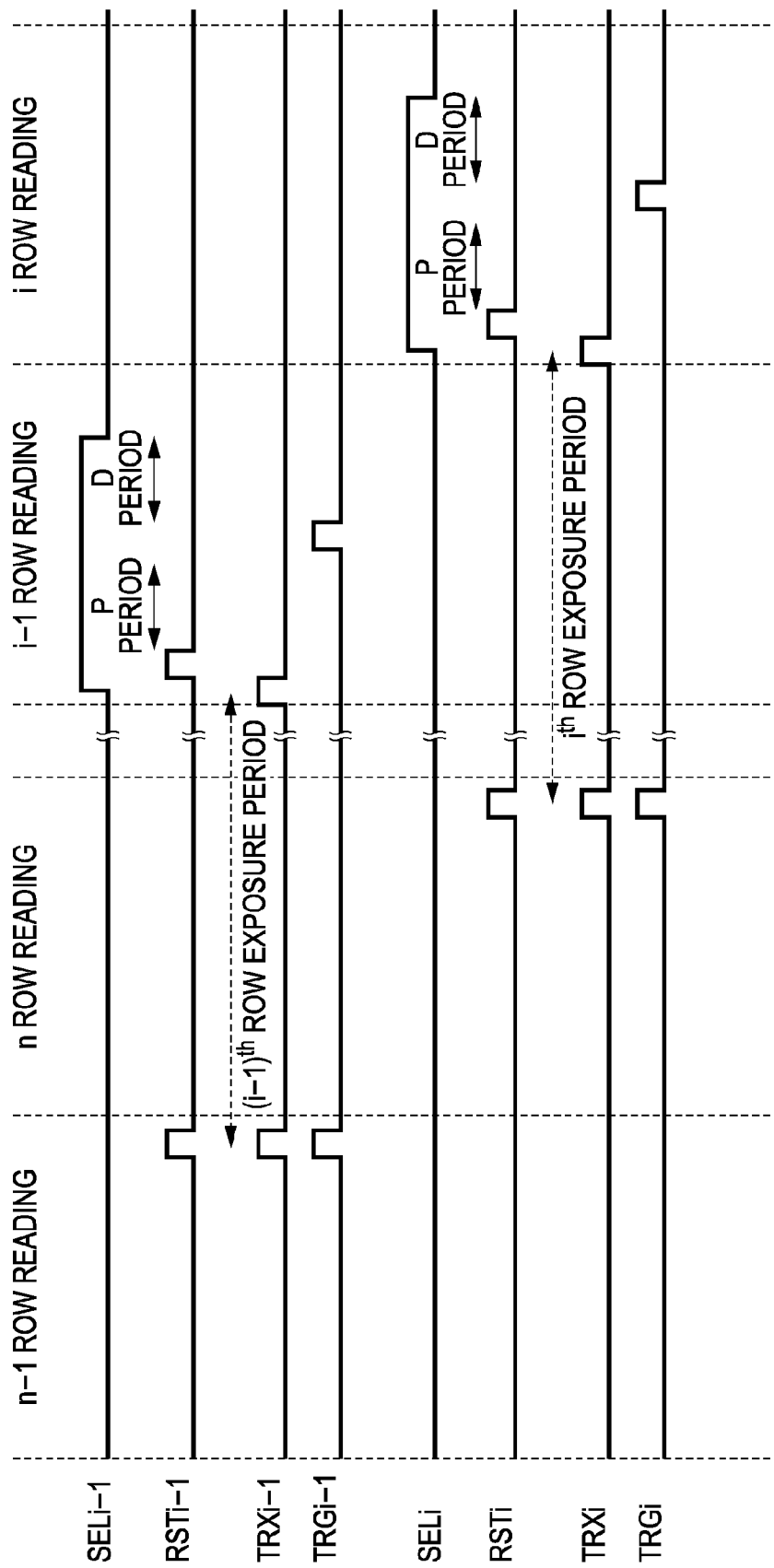
FIG. 11 is a timing chart illustrating a driving example when a rolling shutter operation is performed according to a third embodiment.

FIG. 11 illustrates a driving example in the case of the rolling shutter operation. Before the floating capacitance Cfd of the FD section 27 is reset in the reading period, the transmission pulse TRXi-1 is in an active state and the charges accumulated in the photodiode 21 are transferred to the memory unit 28, so that the exposure period is ended. Then, after the reset pulse RSTi-1 in the active state and the floating capacitance Cfd of the FD section 27 is reset, the reset level is read (P period). Consecutively, after the transmission pulse TRGi-1 is in an active state and the photoelectric charges are transferred from the memory unit 28 to the FD section 27, the signal level is read (D period).

In the signal reading period, before the floating capacitance Cfd is reset by the reset transistor 23, the charges accumulated in the photodiode 21 are transferred to the capacitance Cm of the memory unit 28. That is, the transmission pulse TRX is in the active state prior to the reset pulse RST. In this way, the charges accumulated in the photodiode 21 can be evacuated to the memory unit 28, so that it is possible to realize a driving method for preventing the accumulated charged from being lost from the photodiode 21 through driving by the next reset pulse RST.

When the driving example is employed, the reset pulse RST and the charge discharging pulse OFG of the same pixel can be held in common. Otherwise, as described in the embodiment, with respect to the row scanning direction, as a line of the charge discharging pulse OFG of a pixel which is previously read, the reset line 121-2 of the reset pulse RST of a pixel, which is read thereafter, may be held in common.

5. Fourth Embodiment

Figure 12:
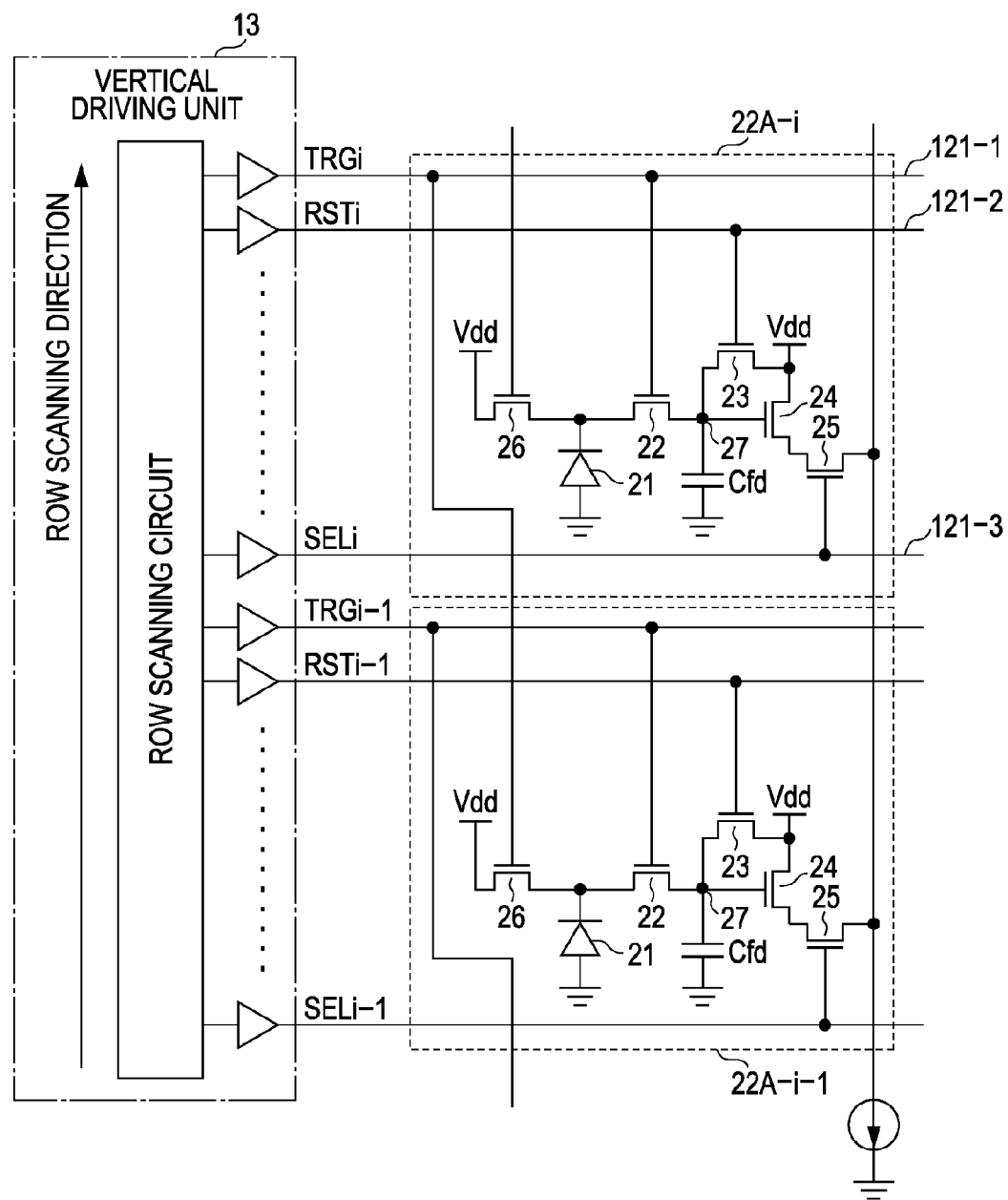
FIG. 12 is a circuit diagram illustrating the configuration of main elements of the CMOS image sensor according to a fourth embodiment of the invention.

FIG. 12 is a circuit diagram illustrating the configuration of main elements of the CMOS image sensor according to the fourth embodiment of the invention. In FIG. 12, the same reference numerals are used to designate the same elements as those shown in FIG. 8.

Similarly to the second embodiment, the CMOS image sensor according to the embodiment is based on the CMOS image sensor in which the unit pixel 20A of the circuit example 1 shown in FIG. 2 is two-dimensionally arranged. Further, in order to simplify FIG. 12, two unit pixels 20A-i and 20A-i-1 of a certain pixel column, which are vertically adjacent to each other, are representatively shown.

As shown in FIG. 12, in the unit pixels 20A-i and 20A-i-1, as the pixel driving lines 121, for example, three driving lines such as the transmission line 121-1, the reset line 121-2 and the selection line 121-3 are provided to each pixel row. These driving lines 121-1, 121-2 and 121-3 are respectively connected to output terminals corresponding to the vertical driving unit 13 by each pixel row.

Then, description will be given while focusing on the $i^{th}$ pixel row. The transmission line 121-1 supplies the gate electrode of the transfer transistor 22 with the transmission pulse TRGi of the $i^{th}$ row, which is output from the vertical driving unit 13, in units of pixel row, and supplies the gate electrode of the charge discharging transistor 26 with the previous row (i.e., the $(i-1)^{th}$ row). That is, as the charge discharging pulse OFGi-1 of the charge discharging transistor 26 of the pixel 20A-i-1 for which signal reading is previously performed with respect to the row scanning direction, the transmission pulse TRGi of the pixel 20A-i, for which signal reading is performed thereafter, is commonly used.

The reset line 121-2 supplies the gate electrode of the reset transistor 23 with the reset pulse RSTi of the $i^{th}$ row, which is output from the vertical driving unit 13, in units of pixel row. The selection line 121-3 supplies the gate electrode of the select transistor 25 with the selection pulse SELi of the $i^{th}$ row, which is output from the vertical driving unit 13, in units of pixel row.

As described above, in the CMOS image sensor according to the fourth embodiment, the charge discharging transistor 26 is driven using the transmission pulse TRGi when performing the driving for reading the signals from the unit pixel 20A. Further, since the transmission pulse TRGi is used as the charge discharging pulse OFG, even if a signal line dedicated for the charge discharging pulse OFG is not provided, the selection line 121-1 for the transmission pulse TRGi is used as the dedicated signal line, so that the charge discharging transistor 26 can be driven.

That is, similarly to the first to third embodiments, even if the signal line dedicated for driving the charge discharging transistor 26 is not added, the charge discharging transistor 26 can be driven. In this way, the configuration, in which the signal line dedicated for driving the charge discharging transistor 26 is not necessary, is employed, so that the reduction in the layout efficiency or sensitivity accompanied by the addition of the charge discharging transistor 26 is not caused.

In particular, as the charge discharging pulse OFGi-1 of the charge discharging transistor 26 of the unit pixel 20A-i-1 for which signal reading is previously performed with respect to the row scanning direction, the transmission pulse TRGi of the unit pixel 20A-i, for which signal reading is performed thereafter, is commonly used, so that the following effects can be obtained. That is, before the charges accumulated in the photodiode 21 are transferred to the FD section 27, the charge discharging transistor 26 is driven, so that it is possible to prevent driving in which the charges accumulated in the photodiode 21 may be lost.

6. Fifth Embodiment

Figure 13:
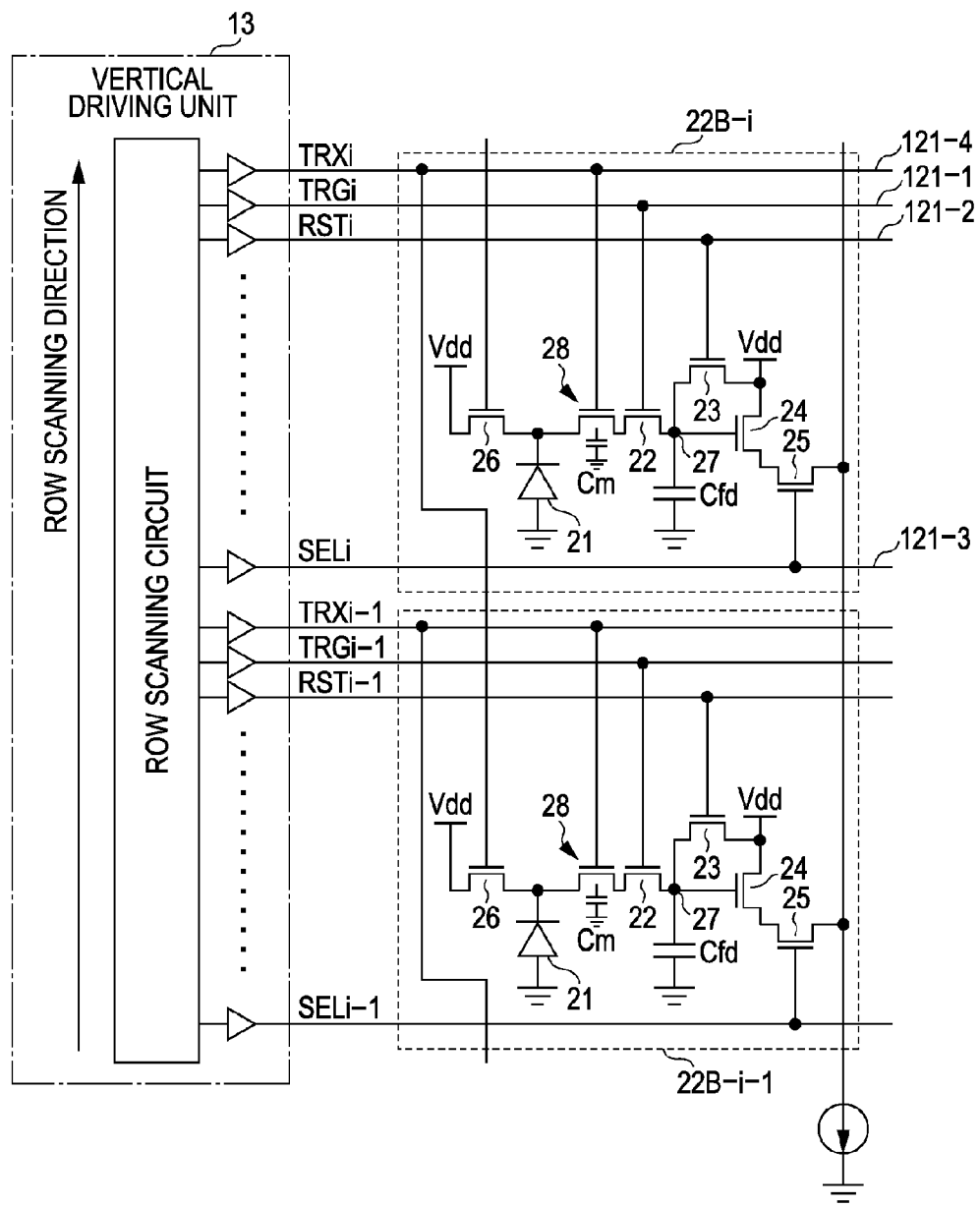
FIG. 13 is a circuit diagram illustrating the configuration of main elements of the CMOS image sensor according to a fifth embodiment of the invention.

FIG. 13 is a circuit diagram illustrating the configuration of main elements of the CMOS image sensor according to the fifth embodiment of the invention. In FIG. 13, the same reference numerals are used to designate the same elements as those shown in FIG. 9.

The CMOS image sensor according to the embodiment is based on the CMOS image sensor in which the unit pixel of the circuit example 2 shown in FIG. 3, that is, the unit pixel 20B including the memory unit 28 that holds charges inside the pixel is two-dimensionally arranged. Further, in order to simplify FIG. 13, two unit pixels 20B-i and 20B-i-1 of a certain pixel column, which are vertically adjacent to each other, are representatively shown.

As shown in FIG. 13, in the unit pixels 20B-i and 20B-i-1, as the pixel driving lines 121, for example, four driving lines such as the transmission line 121-1, the reset line 121-2, the selection line 121-3 and the transmission line 121-4 are provided to each pixel row. These driving lines 121-1, 121-2, 121-3 and 121-4 are respectively connected to output terminals corresponding to the vertical driving unit 13 by each pixel row.

Then, description will be given while focusing on the $i^{th}$ pixel row. The transmission line 121-1 supplies the gate electrode of the transfer transistor 22 with the transmission pulse TRGi of the $i^{th}$ row, which is output from the vertical driving unit 13, in units of pixel row. The reset line 121-2 supplies the gate electrode of the reset transistor 23 with the reset pulse RSTi of the $i^{th}$ row, which is output from the vertical driving unit 13, in units of pixel row. The selection line 121-3 supplies the gate electrode of the select transistor 25 with the selection pulse SELi of the $i^{th}$ row, which is output from the vertical driving unit 13, in units of pixel row.

The transmission line 121-4 supplies the gate electrode of the memory unit 28 with the transmission pulse TRXi of the $i^{th}$ row, which is output from the vertical driving unit 13, in units of pixel row, and supplies the gate electrode of the charge discharging transistor 26 of the previous row (i.e., the $(i-1)^{th}$ row) with the transmission pulse TRXi of the $i^{th}$ row in units of pixel row. That is, as the charge discharging pulse OFGi-1 of the pixel 20B-i-1 for which signal reading is previously performed with respect to the row scanning direction, the transmission pulse TRXi of the pixel 20B-i, for which signal reading is performed thereafter, is commonly used.

As described above, in the CMOS image sensor according to the fifth embodiment, the charge discharging transistor 26 is driven using the transmission pulse TRXi when performing the driving for reading the signals from the unit pixel 20B. Further, since the transmission pulse TRXi is used as the charge discharging pulse OFG, even if a signal line dedicated for the charge discharging pulse OFG is not provided, the transmission line 121-4 for the transmission pulse TRXi is used as the dedicated signal line, so that the charge discharging transistor 26 can be driven.

That is, similarly to the first to fourth embodiments, even if the signal line dedicated for driving the charge discharging transistor 26 is not added, the charge discharging transistor 26 can be driven. In this way, the configuration, in which the signal line dedicated for driving the charge discharging transistor 26 is not necessary, is employed, so that the reduction in the layout efficiency or sensitivity accompanied by the addition of the charge discharging transistor 26 is not caused.

Further, as the charge discharging pulse OFGi-1 of the charge discharging transistor 26 of the pixel 20B-i-1 for which signal reading is previously performed with respect to the row scanning direction, the transmission pulse TRXi of the pixel 20B-i, for which signal reading is performed thereafter, is commonly used, so that the effects identical to that obtained in the fourth embodiment can be obtained. That is, before the charges accumulated in the photodiode 21 are transferred to the FD section 27, the charge discharging transistor 26 is driven, so that it is possible to prevent driving in which the charges accumulated in the photodiode 21 may be lost.

Figure 14:
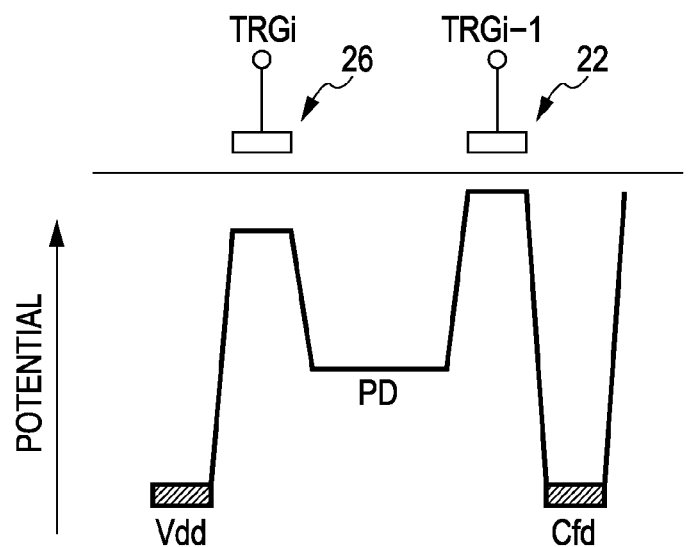
FIG. 14 is a potential diagram illustrating a design example when it is necessary to extract charges accumulated in a photodiode in a state in which photoelectric charges are held in a capacitance Cfd and a capacitance Cm.

In the fourth and fifth embodiments, in the state in which the charges are held in the floating capacitance Cfd of the FD section 27 or the capacitance Cm of the memory unit 28, when it is necessary to extract the charges accumulated in the photodiode 21, the CMOS image sensor is designed as follows. That is, as shown in FIG. 14, it is necessary to design the CMOS image sensor such that the potential barrier of the charge discharging transistor 26 is lower than the potential barrier of the transfer transistor 22.

Figure 15:
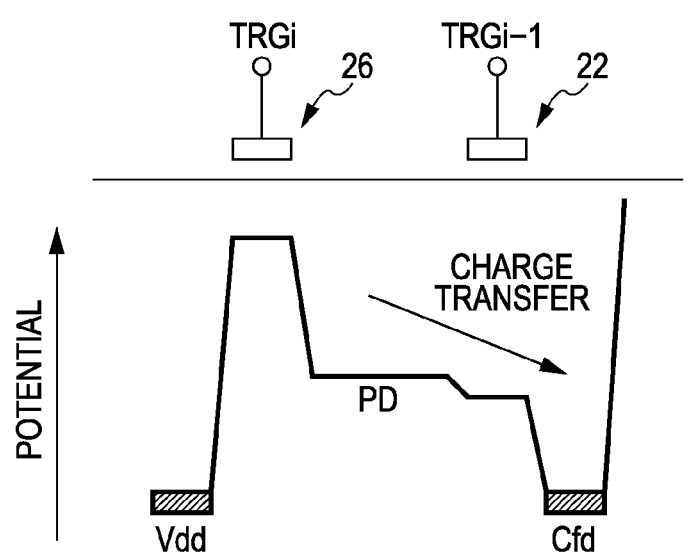
FIG. 15 is a potential diagram illustrating an example in which charges are transferred to a capacitance Cfd without discharging charges accumulated in a photodiode.

When the potential of the elements is designed as described above, since charges may not be transferred to all pixels at the same time, the rolling shutter operation, in which the exposure period is sequentially ended along the row scanning direction, is performed. However, since it is not limited to signal reading in a typical rolling shutter operation, it is possible to obtain a high quality image having high synchronization and low distortion. The charge transfer is performed in the row scanning direction, so that the charges can be transferred to the floating capacitance Cfd of the FD section 27 without discharging the charges accumulated in the photodiode 21 as shown in FIG. 15.

Further, when retention charges exist in the floating capacitance Cfd of the FD section 27, if driving is simultaneously performed with respect to all pixels by the transmission pulse TRG, since excess charges are discharged from a side of the charge discharging transistor 26 having a low potential barrier as shown in FIG. 16A, the excess charges are not added to the retention charges and the discharging of the excess charges is completed as shown in FIG. 16B.

7. Application

In the above embodiments, the CMOS image sensor in which the unit pixel 20 is two-dimensionally arranged has been described as an example. However, the invention is not limited thereto. In detail, in the case of the circuit example 2 as shown in FIG. 3, that is, the unit pixel 20B including the memory unit 28 inside the pixel, the invention can be applied to a CMOS image sensor having a holding structure by plural pixels, in which a part of elements originally provided to each pixel is held in common among a plurality of pixels.

[Pixel Structure for Holding by Two Horizontal Pixels]

Figure 17:
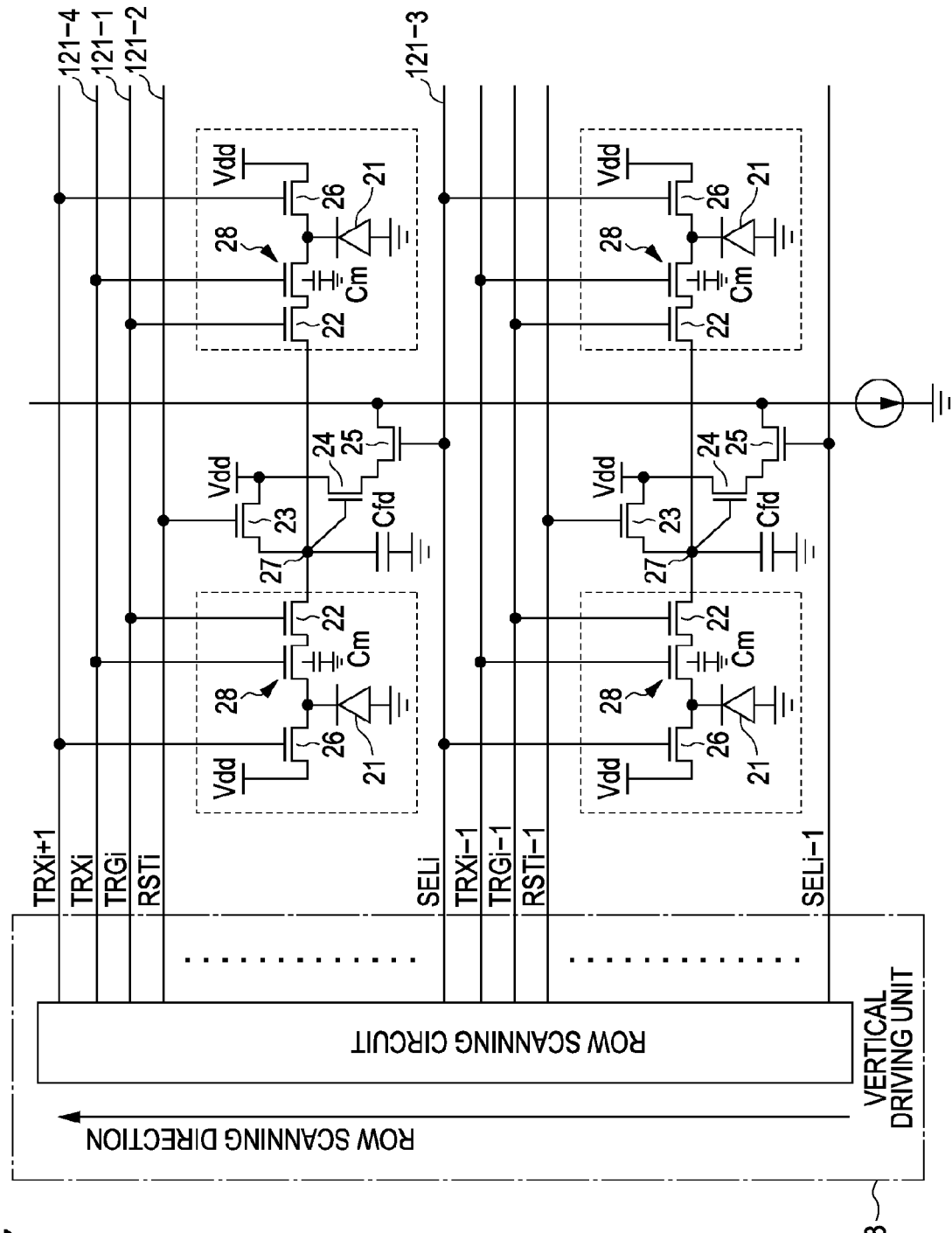
FIG. 17 is a circuit diagram illustrating the configuration of main elements when the invention is applied to a pixel structure for holding by two horizontal pixels.

FIG. 17 is a circuit diagram illustrating the configuration of main elements when the invention is applied to a pixel structure in which a part of elements is held in common between two pixels adjacent to each other in the horizontal direction (transverse direction). In FIG. 17, the same reference numerals are used to designate the same elements as those shown in FIG. 9.

As shown in FIG. 17, in the pixel holding structure according to the application, the reset transistor 23, the amplifying transistor 24, the select transistor 25 and the FD section 27 are held in common between the two pixels adjacent to each other in the horizontal direction. With respect to the pixel structure for holding by two horizontal pixels, according to the application, the selection pulse SELi when performing the driving for reading signals from the unit pixel 20B is used as the charge discharging pulse OFG.

In detail, referring to FIG. 17, as the pixel driving lines 121, for example, four driving lines such as the transmission line 121-1, the reset line 121-2, the selection line 121-3 and the transmission line 121-4 are provided. Then, description will be given while focusing on the $i^{th}$ pixel row. The transmission line 121-1 supplies the gate electrode of the transfer transistor 22 with the transmission pulse TRGi of the $i^{th}$ row, which is output from the vertical driving unit 13, in units of pixel row. The reset line 121-2 supplies the gate electrode of the reset transistor 23 with the reset pulse RSTi of the $i^{th}$ row, which is output from the vertical driving unit 13, in units of pixel row.

The selection line 121-3 supplies the gate electrode of the select transistor 25 with the selection pulse SELi of the $i^{th}$ row, which is output from the vertical driving unit 13, in units of pixel row, and supplies the gate electrode of the charge discharging transistor 26 of the previous row (i.e., the $(i-1)^{th}$ row) with the selection pulse SELi of the $i^{th}$ row in units of pixel row. In this way, as the charge discharging pulse OFGi-1 of the pixel 20B-i-1 for which signal reading is previously performed with respect to the row scanning direction, the selection pulse SELi of the select transistor 25 of the pixel 20B-i, for which signal reading is performed thereafter, is commonly used.

As described above, the invention can also be applied to the pixel structure for holding by the two horizontal pixels. Herein, the selection pulse SELi is used as the charge discharging pulse OFG, but the invention is not limited thereto. That is, the reset pulse RST can be used as the charge discharging pulse OFG similarly to the third embodiment, the transmission pulse TRG can be used as the charge discharging pulse OFG similarly to the fourth embodiment, or the transmission pulse TRX can be used as the charge discharging pulse OFG similarly to the fifth embodiment.

In a pixel holding structure to which the invention is applied, elements held in common are not limited to all elements located after the FD section 27. Further, a pixel holding structure is not limited to holding by pixels arranged in the horizontal direction. That is, the pixel holding structure may include a holding structure in which elements are held in common between two pixels adjacent to each other in the vertical direction (longitudinal direction), a holding structure in which elements are held in common among four pixels adjacent to each other in the horizontal and vertical directions, or the like. In brief, various configurations may be employed if the driving methods according to the previous embodiments can be realized.

8. Modification

According to the previous embodiments, the case in which the unit pixel 20 (20A and 20B) has the pixel configuration including the four transistors in addition to the charge discharging transistor 26 has been described as an example. However, the unit pixel 20 is not limited to the pixel configuration including the four transistors. In detail, differently from the embodiment in which the selection pulse SEL is used as the charge discharging pulse OFG, for example, it is possible to employ a pixel configuration, which includes three transistors, except for the select transistor 25, and, instead, the amplifying transistor 24 has the pixel selection function of the select transistor 25.

Further, according to the previous embodiments, the invention is applied to the CMOS image sensor including the unit pixel which is two-dimensionally arranged to detect signal charges corresponding to the amount of visible rays as a physical quantity. However, application of the invention is not limited to the CMOS image sensor. That is, the invention can be applied to the whole of an X-Y address type solid-state image capturing apparatus having an electronic shutter function.

Further, application of the invention is not limited to a solid-state image capturing apparatus that captures an image by detecting the distribution of the amount of an incident visible ray. That is, the invention can be applied to a solid-state image capturing apparatus that captures the distribution of the amount of incident infrared rays or X rays, or the incident amount of grains or the like as an image. In addition, in a broad sense, a physical quantity distribution detection apparatus (e.g., a fingerprint detection sensor or the like), which captures an image by detecting the distribution of other physical quantities such as pressures or electrostatic capacitances, may be employed as a solid-state image capturing apparatus.

Moreover, a solid-state image capturing apparatus may be prepared in the form of one chip, or a module having an image capturing function, which is formed by packaging an image capturing unit, a signal processing unit and an optical system.

9. Electronic Apparatus

Application of the invention is not limited to a solid-state image capturing apparatus. That is, the invention can be applied to an electronic apparatus, which uses a solid-state image capturing apparatus in an image capturing unit (photoelectric conversion unit), such as an image capturing apparatus (e.g., a digital still camera, a video camera or the like), a portable terminal (e.g., a portable phone or the like) having an image capturing function, or a copy machine which uses a solid-state image capturing apparatus in an image reading unit. Further, the modular type mounted on an electronic apparatus, that is, a camera module may be employed as an image capturing apparatus.

[Image Capturing Apparatus]

Figure 18:
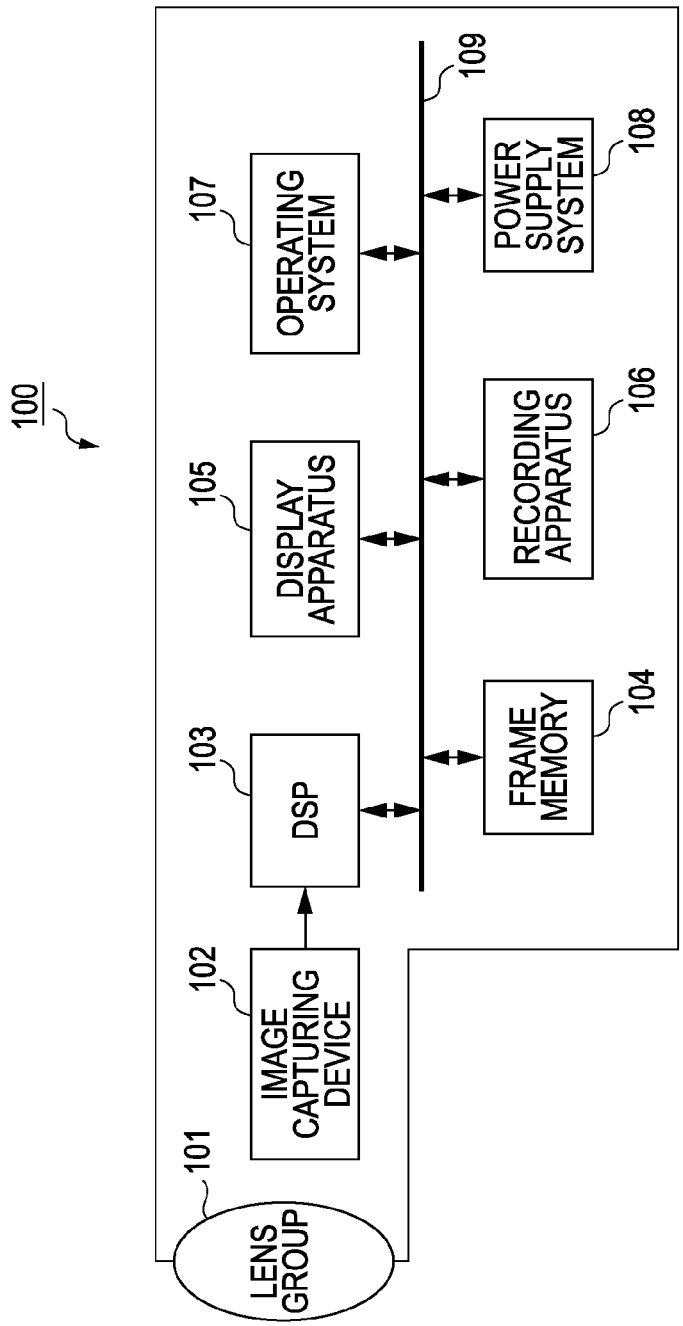
FIG. 18 is a block diagram illustrating a configuration example of an image capturing apparatus which is one example of an electronic apparatus according to the invention.

FIG. 18 is a block diagram illustrating a configuration example of an image capturing apparatus which is one example of the electronic apparatus according to the invention. As shown in FIG. 18, the image capturing apparatus 100 according to the invention includes an optical system including a lens group 101 or the like, an image capturing element 102, a DSP circuit 103 serving as a camera signal processing unit, a frame memory 104, a display device 105, a recording device 106, an operating system 107, a power supply system 108 or the like. The DSP circuit 103, the frame memory 104, the display device 105, the recording device 106, the operating system 107 and the power supply system 108 are connected to each other through a bus line 109.

The lens group 101 captures incident light (image light) from an object and allows an image to be formed on an image capturing surface of the image capturing element 102. The image capturing element 102 converts the amount of the incident light, which is formed on the image capturing surface as the image by the lens group 101, into an electric signal in units of pixels, and outputs a pixel signal. As the image capturing element 102, the CMOS image sensor according to the first to fifth embodiments or the application are used.

The display device 105 includes a panel type display device, such as a liquid crystal display device or an organic EL (Electro Luminescence) display device, and displays a dynamic image or a still image captured by the image capturing element 102. The recording device 106 records the dynamic image or the still image, which has been captured by the image capturing element 102, on a recording medium such as a video tape or a DVD (Digital Versatile Disk).

The operating system 107 issues operation orders with respect to various functions of the image capturing apparatus under the operation of a user. The power supply system 108 various types of power to the DSP circuit 103, the frame memory 104, the display device 105, the recording device 106 and the operating system 107 as operating power.

The image capturing apparatus 100 is applied to a video camera or a digital still camera, and, further, to camera module used for mobile equipment such as a portable phone. In the image capturing apparatus 100, the CMOS image sensor according to the first to fifth embodiments or the application can be used as the image capturing element 102.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state image capturing apparatus comprising:
   a pixel array unit including two-dimensionally arranged pixels each including (i) a photoelectric conversion unit, (ii) a transfer transistor operable to transfer charges accumulated in the photoelectric conversion unit, and (iii) charge discharging transistor operable to selectively discharge the charges accumulated in the photoelectric conversion unit; and
   a driving unit operable to drive (i) reading of signals from each pixel of the pixel array unit, and (ii) the charge discharging transistor using a signal used for transferring the charges accumulated in the photoelectric conversion unit to a memory unit.

2. The solid-state image capturing apparatus according to claim 1, wherein:
   the pixel includes a select transistor operable to perform pixel selection, and
   the driving unit is operable to drive the charge discharging transistor by using a signal used for driving the select transistor.

3. The solid-state image capturing apparatus according to claim 2, wherein the pixel includes:
   a floating capacitance operable to hold the charges transferred from the photoelectric conversion unit by the transfer transistor; and
   a memory unit operable to hold the accumulated charges, separately from the floating capacitance.

4. The solid-state image capturing apparatus according to claim 2, wherein the driving unit has a driving signal of the charge discharging transistor of a pixel, for which signal reading is previously performed in a row scanning direction, together with a driving signal of the select transistor of a pixel for which signal reading is performed thereafter.

5. The solid-state image capturing apparatus according to claim 1, wherein:
   the pixel includes a reset transistor operable to reset the pixel, and
   the driving unit is operable to drive the charge discharging transistor by using a signal used for driving the reset transistor.

6. The solid-state image capturing apparatus according to claim 1, wherein the driving unit is operable to drive the charge discharging transistor by using a signal used for driving the transfer transistor.

7. The solid-state image capturing apparatus according to claim 6, wherein the driving unit has a driving signal of the charge discharging transistor of a pixel, for which signal reading is previously performed in a row scanning direction, together with a driving signal of the transfer transistor of a pixel for which signal reading is performed thereafter.

8. The solid-state image capturing apparatus according to claim 1, wherein
   the pixel includes a floating capacitance operable to hold the charges transferred from the photoelectric conversion unit by the transfer transistor; and
   the memory unit is operable to hold the accumulated charges separately from the floating capacitance.

9. The solid-state image capturing apparatus according to claim 1, wherein a potential barrier of the charge discharging transistor is lower than a potential barrier of the transfer transistor with respect to the charges accumulated in the photoelectric conversion unit.

10. An electronic apparatus comprising a solid-state image capturing apparatus, the solid-state image capturing apparatus including:
    a pixel array unit including two-dimensionally arranged pixels each including (i) a photoelectric conversion unit, (ii) transfer transistor operable to transfer charges accumulated in the photoelectric conversion unit, and (iii) a charge discharging transistor operable to selectively discharge the charges accumulated in the photoelectric conversion unit; and
    a driving unit operable to drive (i) reading of signals from each pixel of the pixel array unit, and (ii) the charge discharging transistor using a signal used for driving the transfer transistor.

11. The solid-state image capturing apparatus according to claim 10, wherein the driving unit has a driving signal of the charge discharging transistor of a pixel, for which signal reading is previously performed in a row scanning direction, together with a driving signal of the transfer transistor of a pixel for which signal reading is performed thereafter.

12. The solid-state image capturing apparatus according to claim 10, wherein the pixel includes:
    a floating capacitance operable to hold the charges transferred from the photoelectric conversion unit by the transfer transistor; and
    a memory unit operable to hold the accumulated charges separately from the floating capacitance,
    wherein,
    the driving unit is operable to drive the charge discharging transistor by using a signal used for transferring the charges accumulated in the photoelectric conversion unit to the memory unit.

13. The solid-state image capturing apparatus according to claim 12, wherein the driving unit has a driving signal of the charge discharging transistor of a pixel, for which signal reading is previously performed in a row scanning direction, together with a signal transferred to the memory unit of a pixel for which signal reading is performed thereafter.

* * * * *